(12) United States Patent
Hugon et al.

(10) Patent No.: US 11,164,506 B2
(45) Date of Patent: Nov. 2, 2021

(54) OPTOELECTRONIC DEVICE

(71) Applicant: Aledia, Grenoble (FR)

(72) Inventors: Xavier Hugon, Teche (FR); Philippe Gilet, Teche (FR); Ivan-Christophe Robin, Grenoble (FR); Zine Bouhamri, Grenoble (FR); Frédéric Mercier, Saint Nicolas de Macherin (FR); Matthieu Charbonnier, Fontaine (FR)

(73) Assignee: Aledia, Echirolles (FR)

( * ) Notice: Subject to any disclaimer, the term of this patent is extended or adjusted under 35 U.S.C. 154(b) by 6 days.

(21) Appl. No.: 16/631,809

(22) PCT Filed: Jul. 19, 2018

(86) PCT No.: PCT/FR2018/051850
§ 371 (c)(1),
(2) Date: Jan. 16, 2020

(87) PCT Pub. No.: WO2019/016482
PCT Pub. Date: Jan. 24, 2019

(65) Prior Publication Data
US 2020/0152113 A1    May 14, 2020

(30) Foreign Application Priority Data
Jul. 21, 2017   (FR) ...................... 1756985

(51) Int. Cl.
*G09G 3/20* (2006.01)
*G09G 3/32* (2016.01)
*H01L 27/15* (2006.01)

(52) U.S. Cl.
CPC ............ *G09G 3/2085* (2013.01); *G09G 3/32* (2013.01); *H01L 27/156* (2013.01); *G09G 2360/141* (2013.01)

(58) Field of Classification Search
CPC .. G09G 3/32; G09G 3/2085; G09G 2360/141; H01L 27/156
See application file for complete search history.

(56) References Cited

U.S. PATENT DOCUMENTS

| 5,739,802 A | 4/1998 | Mosier |
| 2004/0004443 A1 | 1/2004 | Park et al. |

(Continued)

OTHER PUBLICATIONS

International Preliminary Report on Patentability for International Application No. PCT/FR2018/051850, dated Jan. 30, 2020.

(Continued)

*Primary Examiner* — Abbas I Abdulselam
(74) *Attorney, Agent, or Firm* — Wolf, Greenfield & Sacks, P.C.

(57) ABSTRACT

A method of controlling an optoelectronic device including display pixels arranged in rows and in columns. The optoelectronic device further includes first electrodes, each connected to the display pixels of at least one row, second electrodes, each connected to the display pixels of at least one column, and a circuit for controlling the first and second electrodes. The method includes, in a first phase, the activation of the display pixels connected to one of the first electrodes and to one of the second electrodes by the following steps, simultaneously carried out: taking one of the first electrodes to a first potential, the other first electrodes being maintained at a second potential smaller than the first potential; and taking one of the second electrodes to a third potential smaller than the second potential, the other second electrodes being maintained at a fourth potential greater than the third potential and smaller than the second potential.

18 Claims, 12 Drawing Sheets

(56) References Cited

U.S. PATENT DOCUMENTS

| | | |
|---|---|---|
| 2005/0169600 A1 | 8/2005 | Katase |
| 2006/0132452 A1 | 6/2006 | Krijn et al. |
| 2008/0165120 A1 | 7/2008 | Johnson |
| 2009/0073079 A1* | 3/2009 | Miller ................. H01L 27/3293 345/1.3 |
| 2011/0050658 A1 | 3/2011 | White et al. |
| 2015/0338695 A1* | 11/2015 | Xu ........................ G06F 3/0412 349/12 |
| 2016/0172410 A1* | 6/2016 | Kurokawa ........ H01L 27/14623 257/42 |

OTHER PUBLICATIONS

International Search Report and Written Opinion for International Application No. PCT/FR2018/051850, dated Oct. 26, 2018.

\* cited by examiner

OPTOELECTRONIC DEVICE

This Application is a national stage filing under 35 U.S.C. § 371 of International Patent Application Serial No. PCT/FR2018/051850, filed Jul. 19, 2018, which claims priority to French patent application FR17/56985, filed Jul. 21, 2017, the contents of these applications are incorporated herein by reference in their entirety.

BACKGROUND

The present disclosure concerns an optoelectronic device, particularly a display screen or an image projection device, comprising light-emitting diodes, called LEDs hereafter, based on semiconductor materials, and their manufacturing methods.

DISCUSSION OF THE RELATED ART

A pixel of an image corresponds to the unit element of the image displayed by the optoelectronic device. When the optoelectronic device is a color image display screen, it generally comprises, for the display of each pixel of the image, at least three components, also called display sub-pixels, which each emit a light radiation substantially in a single color (for example, red, green, and blue). The superposition of the radiations emitted by the three display sub-pixels provides the observer with the colored sensation corresponding to the pixel of the displayed image. In this case, the assembly formed by the three display sub-pixels used to display a pixel of an image is called display pixel of the optoelectronic device.

Each display sub-pixel may comprise a light source, particularly a light-emitting diode, for example, made up of semiconductor materials. A known method of manufacturing an optoelectronic device, particularly a display screen or an image projection device, comprising light-emitting diodes, called "pick and place" method, comprises manufacturing the light-emitting diodes in the form of separate components and placing each light-emitting diode at a desired position on a support which may comprise conductive tracks for the electric connection of the light-emitting diodes.

A disadvantage of such a method is that it generally requires accurately placing the light-emitting diodes on the support. This requires implementing alignment methods which are all the more complex as the dimensions of the light-emitting diodes are decreased.

Another disadvantage of such a method is that an increase in the resolution of the optoelectronic device results in an increase in the number of transfers of light-emitting diodes onto the support and thus in an increase in the duration of the optoelectronic device manufacturing, which may be incompatible with a manufacturing at an industrial scale.

To form a large LED display made up of assembled unit LED components, the LEDs should be assembled with control circuits which control a number of LEDs. The different units are coupled together by wires. Such an assembly decreases the quantity of data that can be transmitted and it is difficult to display a video stream.

For micrometer-range LED displays, called μLEDs hereafter, for the formats of TV, tablet, smart phone type which are being developed by several manufacturers, an active array is necessary to display a video stream with a high resolution. Currently, active arrays for displays are formed in thin film transistors, or TFTs. TFTs use deposits of amorphous silicon or polysilicon on large glass surface areas and require using complex microelectronics methods on large surface areas.

The use of so-called smart pixels integrating control electronics with the LEDs or μLEDs may enable to form TFT-free active arrays. Such active arrays may be formed on very large surface areas since they are based on the electronics embarked under the pixel. On the other hand, such electronics would benefit from the performance of the silicon-based technology. Large outdoor or indoor screens integrating this technology may be controlled by active matrix, thereby increasing their brightness and, further, may display larger data streams.

Another advantage of the approach is the forming of large screens with a very large number of pixels. No constraint is imposed by predefined TFT active matrices or by electronics to be assembled.

SUMMARY

Thus, an object of an embodiment is to at least partly overcome the disadvantages of the previously-described optoelectronic devices comprising light-emitting diodes.

Another object of an embodiment is to decrease the number of transfers of components onto the support of the optoelectronic device during the manufacturing of the optoelectronic device.

Another object of an embodiment is to decrease accuracy constraints on placing of components on the support of the optoelectronic device.

Another object of an embodiment is for optoelectronic devices to be capable of being manufactured at an industrial scale and at a low cost.

Another object is for the optoelectronic device to comprise an active array.

Another object is for the optoelectronic device to enable to display a video stream.

Thus, an embodiment provides a method of controlling an optoelectronic device comprising display pixels arranged in rows and in columns, each display pixel comprising an electronic circuit and at least one first optoelectronic circuit coupled to the electronic circuit and comprising at least one first light-emitting diode, the optoelectronic device further comprising first electrodes extending along the rows, each first electrode being connected to the electronic circuits of display pixels of at least one of the rows, second electrodes extending along the columns, each second electrode being connected to the electronic circuits of display pixels of at least one of the columns, and a circuit for controlling the first and second electrodes, the method comprising, in a first phase, the activation of the electronic circuits connected to one of the first electrodes and to one of the second electrodes by the following steps, carried out simultaneously:

taking one of the first electrodes to a first potential, the other first electrodes being maintained at a second potential smaller than the first potential; and taking one of the second electrodes to a third potential smaller than the second potential, the other second electrodes being maintained at a fourth potential greater than the third potential and smaller than the second potential.

According to an embodiment, the method comprises, after the first phase, a second phase comprising transmitting data to the electronic circuits connected to said one of the first electrodes and to said one of the second electrodes at the fourth potential by varying the potential of said one of the first electrodes between the first potential and the second potential and by maintaining the potential of said one of the second electrodes at the fourth potential.

According to an embodiment, the method comprises, during the second phase, transmitting signals having a discrete duration and transmitting signals having a non-discrete duration.

According to an embodiment, during the second phase, the electronic circuits coupled to said one of the first electrodes and which are not coupled to said one of the second electrodes do not process the transmitted data.

According to an embodiment, the method comprises turning off the light-emitting diodes of the display pixels coupled to said one of the first electrodes and/or to said one of the second electrodes.

According to an embodiment, each first optoelectronic circuit comprises a first transistor series-assembled with the first light-emitting diode, the second phases comprising maintaining said one of the first electrodes at the first potential for a first time period and the first transistor is controlled at a first conduction level which depends on the first time period.

According to an embodiment, each display pixel comprises at least one second optoelectronic circuit coupled to the electronic circuit of said display pixel and comprising at least a second light-emitting diode and a second transistor series-assembled with the second light-emitting diode, the second phase comprising maintaining said one of the first electrodes at the first potential for a second time period and the second transistor is controlled at a second conduction level which depends on the third time period.

According to an embodiment, each display pixel comprises at least one third optoelectronic circuit coupled to the electronic circuit of said display pixel and comprising at least one third light-emitting diode and a third transistor series-assembled with the third light-emitting diode, the second phase comprising the maintaining of said one of the first electrodes at the first potential for a third time period and the third transistor is controlled at a third conduction level which depends on the third time period.

According to an embodiment, the first, second, and third time periods are successive, said one of the first electrodes being maintained at the second potential between the first time period and the second time period and for the second time period and the third time period.

An embodiment also provides an optoelectronic device comprising display pixels arranged in rows and in columns, each display pixel comprising an electronic circuit and at least one first optoelectronic circuit coupled to the electronic circuit and comprising at least one first light-emitting diode, the optoelectronic device further comprising first electrodes extending along the rows, each first electrode being connected to the electronic circuits of display pixels of at least one of the rows, second electrodes extending along the columns, each second column being connected to the electronic circuits of display pixels of at least one of the columns, and a circuit for controlling the first and second electrodes capable, during a first phase, of simultaneously:

taking one of the first electrodes to a first potential, the other first electrodes being maintained at a second potential smaller than the first potential; and taking one of the second electrodes to a third potential smaller than the second potential, the other second electrodes being maintained at a fourth potential greater than the third potential and smaller than the second potential, which results in the activation of the electronic circuits connected to said one of the first electrodes and to said one of the second electrodes.

According to an embodiment, the control circuit is capable, after the first phase, during a second phase, of transmitting data to the electronic circuits connected to said one of the first electrodes and to said one of the second electrodes by varying the potential of said one of the first electrodes between the first potential and the second potential and by maintaining the potential of said one of the second electrodes at the fourth potential.

According to an embodiment, the control circuit is capable, during the second phase, of transmitting signals having a discrete duration and signals having a non-discrete duration.

According to an embodiment, during the second phase, the electronic circuits coupled to said one of the first electrodes and which are not coupled to said one of the second electrodes are capable of not processing the transmitted data.

According to an embodiment, the electronic circuits coupled to said one of the first electrodes and/or to said one of the second electrodes are capable of turning off the associated light-emitting diodes.

According to an embodiment, each first optoelectronic circuit comprises a first transistor series-assembled with the first light-emitting diode, the control circuit being capable, during the second phase, of maintaining said one of the first electrodes at the first potential for a first time period, the first optoelectronic circuit being capable of turning on the first transistor at a first conduction level which depends on the first time period.

According to an embodiment, each display pixel comprises at least one second optoelectronic circuit coupled to the electronic circuit of said display pixel and comprising at least a second light-emitting diode and a second transistor series-assembled with the second light-emitting diode, the control circuit being capable, during the second phase, of maintaining said one of the first electrodes at the first potential for a first time period, the second optoelectronic circuit being capable of turning on the second transistor at a second conduction level which depends on the second time period.

According to an embodiment, each display pixel comprises at least one third optoelectronic circuit coupled to the electronic circuit and comprising at least a third light-emitting diode and a third transistor series-assembled with the third light-emitting diode, the control circuit being capable, during the second phase, of maintaining said one of the first electrodes at the first potential for a third time period, the third optoelectronic circuit being capable of turning on the third transistor at a third conduction level which depends on the third time period.

According to an embodiment, the first, second, and third time periods are successive, the control circuit being capable of maintaining said one of the first electrodes at the second potential between the first time period and the second time period and for the second time period and the third time period.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION

Figure 1:
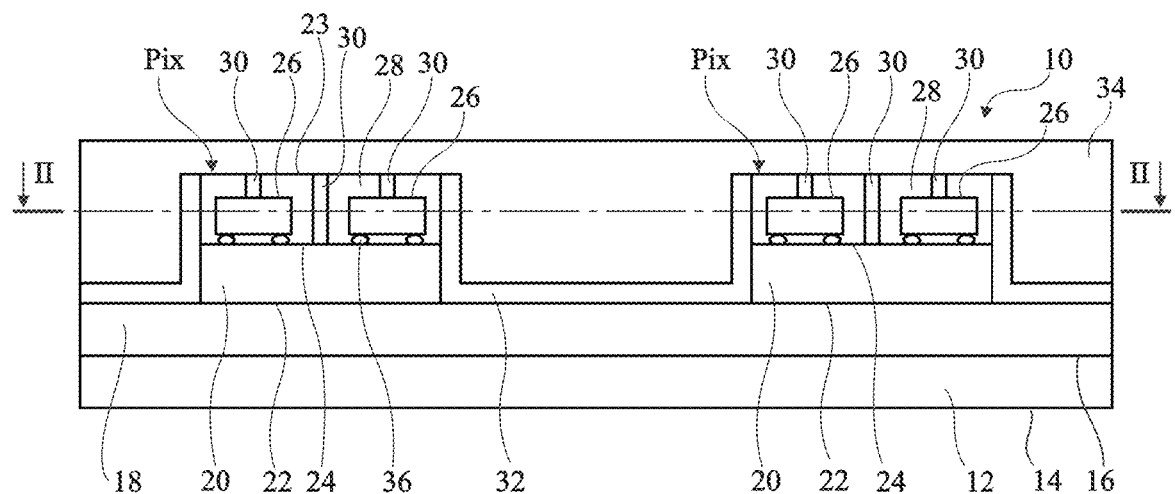
FIGS. 1 and 2 respectively are a lateral cross-section view and a top view, partial and simplified, of an embodiment of an optoelectronic device.

For clarity, the same elements have been designated with the same reference numerals in the various drawings and, further, as usual in the representation of electronic circuits, the various drawings are not to scale. Further, only those elements which are useful to the understanding of the present disclosure have been shown and will be described. In particular, the structure of a light-emitting diode is well known by those skilled in the art and has not been described in detail.

In the following description, when reference is made to terms qualifying the relative position, such as term "top", "below", "upper", or "lower", etc., reference is made to the orientation of the drawings or to an optoelectronic device in a normal position of use. Unless otherwise specified, terms "about", "approximately", and "in the order of" mean to within 10%, preferably to within 5%. Further, the "active area" of a light-emitting diode designates the region of the light-emitting diode from which most of the electromagnetic radiation provided by the light-emitting diode is emitted. Further, a signal which alternates between a first constant state, for example, a low state, noted "0", and a second constant state, for example, a high state, noted "1", is called "binary signal". The high and low states of different binary signals of a same electronic circuit may be different. In particular, the binary signals may correspond to voltages or to currents which may not be perfectly constant in the high or low state.

Figure 2:
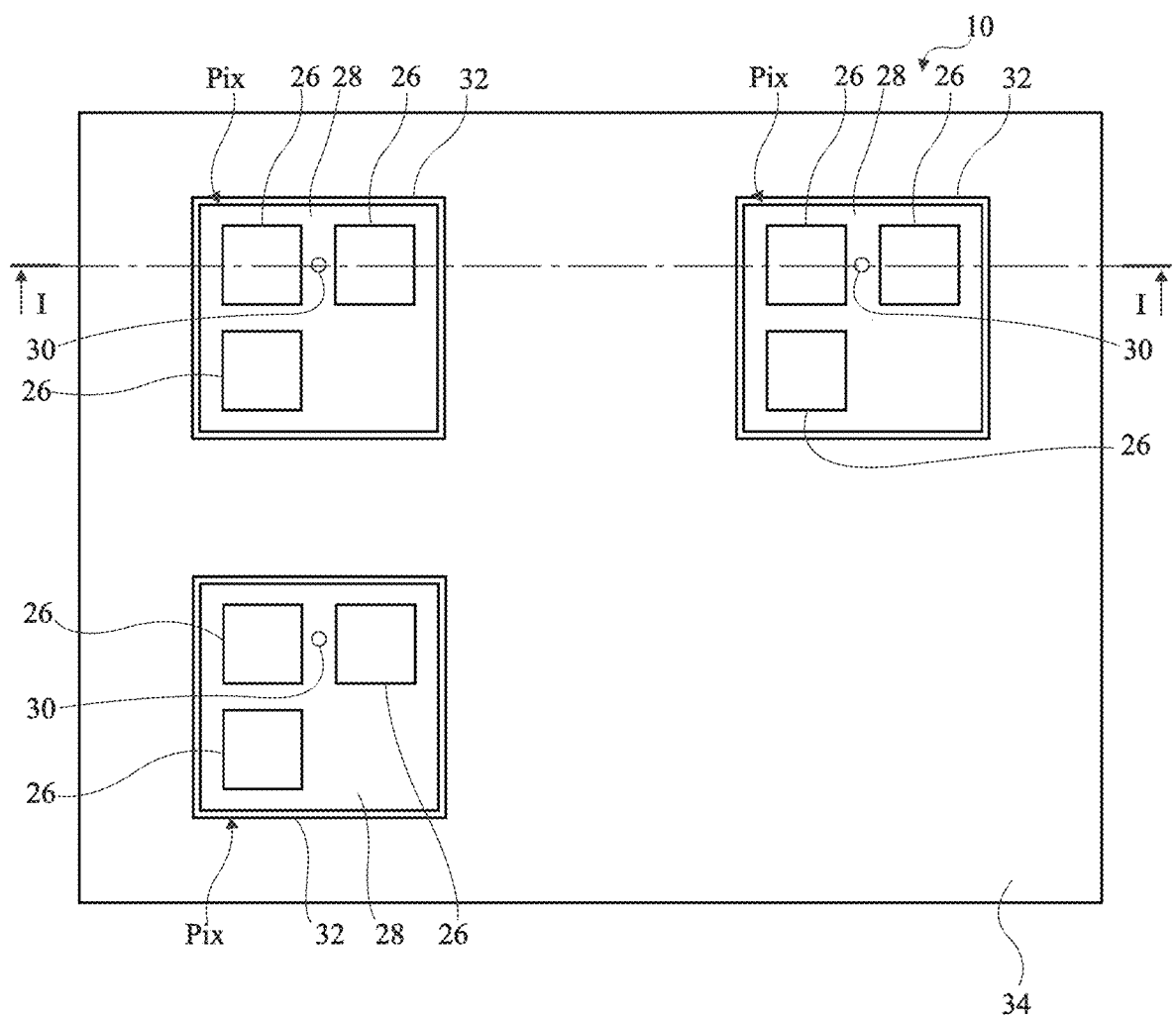

FIGS. 1 and 2 show an embodiment of an optoelectronic device 10, for example, corresponding to a display screen or to an image projection device, comprising display pixels, two display pixels being shown in FIG. 1 and three display pixels being shown in FIG. 2. FIG. 1 is a cross-section view of FIG. 2 along line II-II and FIG. 2 is a cross-section view of FIG. 1 along line I-I.

Device 10 comprises, from bottom to top in FIG. 1:

a support 12, comprising opposite lower and upper surfaces 14, 16, preferably parallel;

a first electrode layer 18 comprising an electrically-conductive layer 18 covering upper surface 16;

display pixels Pix, also called display pixel circuit hereafter, resting on electrode layer 18 and in contact with electrode layer 18, each display pixel Pix comprising:

an electronic circuit 20, called control circuit hereafter, having opposite lower and upper surfaces 22, 24 preferably parallel, lower surface 22 being bonded to electrode layer 18, for example, via a bonding material;

optoelectronic circuits 26 bonded to upper surface 24 of electronic circuit 20, three optoelectronic circuits 26 per display pixels Pix being shown in FIG. 2, each optoelectronic circuit 26 comprising at least one light-emitting diode, not shown;

an electrically-insulating portion 28 covering optoelectronic circuits 26 and covering upper surface 24 of control circuit 20 between optoelectronic circuits 26;

electrically-conductive elements 30 crossing insulating portion 28, coming into contact with optoelectronic circuits 26 and upper surface 24 of control circuit 20;

an electrically-insulating layer 32 covering electrode layer 18 between display pixels Pix and covering the lateral sides of electronic circuits 20 and possible of insulating portions 28; and a second electrode layer 34 comprising an electrically-conductive layer at least partially transparent to the radiations emitted by the light-emitting diodes, conductive layer 34 covering insulating layer 32 and insulating portions 28 and being in contact with the conductive elements 30 of each display pixel Pix.

An encapsulation layer, not shown, may cover conductive layer 34.

When lower surface 22 of electronic circuit 20 is bonded to electrode layer 18 by a bonding material, the bonding material is preferably electrically conductive. As a variation, a bonding material which is not electrically conductive, for example, arranged at the periphery of lower surface 22 of electronic circuit 20, may be used.

According to an embodiment, each optoelectronic circuit 26 comprises at least one light-emitting diode. In the case where optoelectronic circuit 26 comprises two or more than two light-emitting diodes, all the light-emitting diodes of optoelectronic circuit 26 preferably emit a light radiation substantially at the same wavelength.

Each light-emitting diode may correspond to a so-called two-dimensional light-emitting diode comprising a stack of substantially planar semiconductor layers including the active area. Each light-emitting diode may comprise at least one three-dimensional light-emitting diode having a radial structure comprising a semiconductor shell covering a three-dimensional semiconductor element, particularly a microwire, a nanowire, a cone, a frustum, a pyramid, or a truncated pyramid, the shell being formed of a stack of non-planar semiconductor layers including the active area. Examples of such light-emitting diodes are described in patent application US2014/0077151 and US2016/0218240. Each light-emitting diode may comprise at least one three-dimensional light-emitting diode having an axial structure where the shell is located in the axial extension of the semiconductor element.

For each display pixel Pix, optoelectronic circuit 26 may be bonded to control circuit 20 by a "flip-chip" type connection. Fusible conductive elements 36, for example, solder balls or indium balls, which couple optoelectronic circuit 26 to control circuit 20 ensure the mechanical coupling between optoelectronic circuit 26 and control circuit 20 and further ensure the electric connection of the light-emitting diode or the light-emitting diodes of optoelectronic circuit 26 to control circuit 20. According to another embodiment, each optoelectronic circuit 26 may be bonded to control circuit 20 by direct bonding.

According to an embodiment, each display pixel Pix comprises at least two types of optoelectronic circuits 26. The optoelectronic circuit 26 of the first type is capable of emitting a first radiation at a first wavelength and the optoelectronic circuit 26 of the second type is capable of emitting a second radiation at a second wavelength. According to an embodiment, each display pixel Pix comprises at least three types of optoelectronic circuits 26, the optoelectronic circuit 26 of the third type being capable of emitting a third radiation at a third wavelength. The first, second, and third wavelengths may be different.

According to an embodiment, the first wavelength corresponds to blue light and is within the range from 430 nm to 490 nm. According to an embodiment, the second wavelength corresponds to green light and is within the range from 510 nm to 570 nm. According to an embodiment, the third wavelength corresponds to red light and is within the range from 600 nm to 720 nm.

According to an embodiment, each display pixel Pix comprises an optoelectronic circuit 26 of a fourth type, the optoelectronic circuit 26 of the fourth type being capable of emitting a fourth radiation at a fourth wavelength. The first, second, third, and fourth wavelengths may be different. According to an embodiment, the fourth wavelength corresponds to yellow light and is in the range from 570 nm to 600 nm. According to another embodiment, the fourth radiation corresponds to a radiation in close infrared, particularly at a wavelength between 700 nm and 980 nm, to an ultraviolet radiation, or to white light.

Each optoelectronic circuit 26 may comprise a semiconductor substrate having the light-emitting diode or the light-emitting diodes resting thereon. The semiconductor substrate for example is a substrate made of silicon, of germanium, of silicon carbide, of a III-V compound such as GaN or GaAs, a ZnO substrate, or a sapphire substrate. According to another embodiment, it is possible for each optoelectronic circuit 26 to comprise no substrate. A mirror layer may then be arranged on the lower surface of optoelectronic circuit 26 in contact with the light-emitting diode or the light-emitting diodes. According to an embodiment, the mirror layer is capable of at least partly reflecting the radiation emitted by the light-emitting diodes.

Each control circuit 20 may comprise electronic components, not shown, particularly transistors, used to control the light-emitting diodes. Each control circuit 26 may comprise a semiconductor substrate having the electronic components formed inside thereof and/or on top thereof. Lower surface 22 of control circuit 20 may then correspond to the rear surface of the substrate opposite to the front surface of the substrate on the side of which the electronic components are formed. The semiconductor substrate is, for example, a substrate made of silicon, particularly, of single-crystal silicon.

Preferably, optoelectronic circuits 26 only comprise light-emitting diodes and elements of connection of the light-emitting diodes and control circuits 20 comprise all the electronic components necessary to control the light-emitting diodes of optoelectronic circuits 26. As a variation, optoelectronic circuits 26 may also comprise other electronic components in addition to the light-emitting diodes.

Optoelectronic device 10 may comprise from 10 to $10^9$ display pixels Pix. Each display pixel Pix may occupy in top view a surface area in the range from 1 µm² to 100 mm². The thickness of each display pixel Pix may be in the range from 100 µm to 10 mm. The thickness of each electronic circuit 20 may be in the range from 1 µm to 2,000 µm. The thickness of each optoelectronic circuit 26 may be in the range from 0.2 µm to 1,000 µm.

Support 12 may be made of an electrically-insulating material, for example, comprising a polymer, particularly an epoxy resin, and in particular the FR4 material used for the manufacturing of printed circuits, or of a metallic material, for example, aluminum. The thickness of support 12 may be in the range from 100 µm to 10 mm.

Conductive layer 18 preferably corresponds to a metal layer, for example, aluminum, silver, copper, or zinc. The thickness of conductive layer 18 may be in the range from 0.5 µm to 1,000 µm.

Each insulating portion 28 may be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride ($SiO_xN_y$, where x may be approximately equal to ½ and y may be approximately equal to 1, for example, $Si_2ON_2$), of aluminum oxide ($Al_2O_3$), or of hafnium oxide ($HfO_2$). The maximum thickness of each insulating portion 28 may be in the range from 0.5 µm to 1,000 µm.

Each conductive element 30 may be made of a material selected from the group comprising copper, titanium, nickel, gold, tin, aluminum, and alloys of at least two of these compounds.

Insulating layer 32 may be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride ($SiO_xN_y$, where x may be approximately equal to ½ and y may be approximately equal to 1, for example, $Si_2ON_2$), of aluminum oxide ($Al_2O_3$), or of hafnium oxide ($HfO_2$). The thickness of insulating layer 32 may be in the range from 0.02 µm to 1,000 µm. Preferably, insulating layer 32 is opaque. Insulating layer 32 may correspond to a white resin, to a black resin, or to a transparent resin filled, particularly, with titanium particles.

Conductive layer 34 is capable of letting through the electromagnetic radiation emitted by the light-emitting diodes. The material forming conductive layer 34 may be a transparent conductive material such as indium tin oxide (ITO), aluminum or gallium zinc oxide, or graphene. The minimum thickness of electrically-conductive layer 34 on display pixels Pix may be in the range from 0.1 µm to 1,000 µm.

The encapsulation layer may be made of an at least partially transparent insulating material. The encapsulation layer may be made of an at least partially transparent inorganic material. As an example, the inorganic material is selected from the group comprising silicon oxides of $SiO_x$ type, where x is a real number between 1 and 2 or $SiO_yN_z$, where y and z are real numbers between 0 and 1, and aluminum oxides, for example, $Al_2O_3$. The encapsulation layer may be made of an at least partially transparent organic material. As an example, the encapsulation layer is a silicone polymer, an epoxy polymer, an acrylic polymer, or a polycarbonate.

According to an embodiment, in operation, a voltage $V_E$ is applied between electrode layers 34 and 18 for the supply of display pixels Pix, particularly of the light-emitting diodes of optoelectronic circuits 26 of display pixels Pix.

Figure 3:
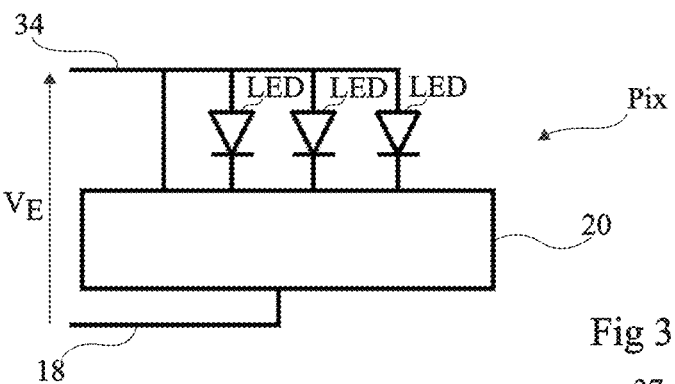
FIG. 3 is an equivalent electric diagram of a display pixel of the optoelectronic device shown in FIGS. 1 and 2.

FIG. 3 shows an equivalent electric diagram of the display pixel Pix shown in FIGS. 1 and 2. A first electrode, for example, the cathode, of each light-emitting diode LED is connected to the control circuit 20 of display pixel Pix while the second electrode of each light-emitting diode LED, for example, the anode, is connected to electrode layer 34. Control circuit 20 is connected between electrode layers 18 and 34 and receives voltage $V_E$. Circuit 20 controls the light-emitting diodes of optoelectronic circuits 26.

Figure 4A:
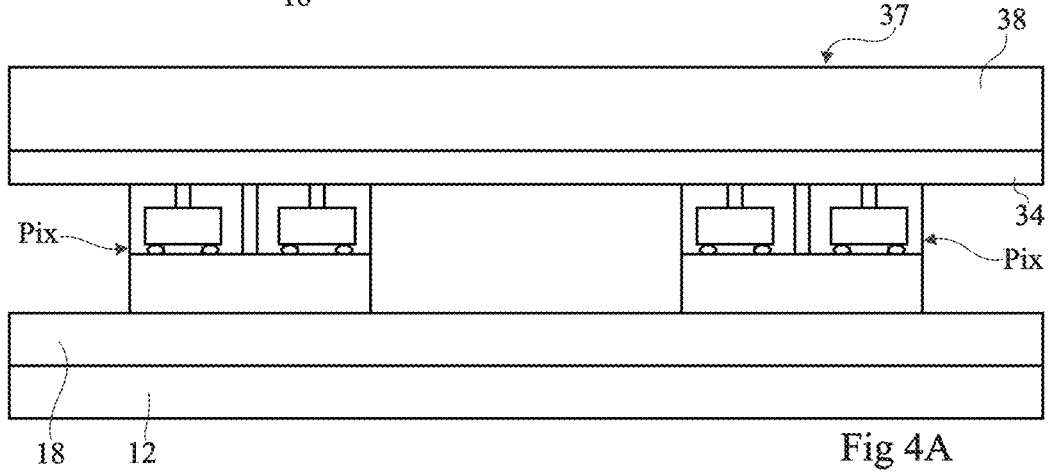
FIGS. 4A and 4B are partial simplified lateral cross-section views of other embodiments of an optoelectronic device.

FIG. 4A is a view similar to FIG. 1 of another embodiment of an optoelectronic device 37 comprising all the elements of optoelectronic device 10, with the difference that insulating layer 32 is not present and that electrode layer 34 rests on a substrate 38. A method of manufacturing optoelectronic device 37 comprises forming electrode layer 18 on support 12, assembling display pixels Pix on electrode layer 18, forming electrode layer 34 on substrate 38, and then hybridizing display pixels Pix on electrode layer 34. Support 12 and substrate 38 may be flexible, which enables to manufacture a flexible optoelectronic device 37.

Figure 4B:
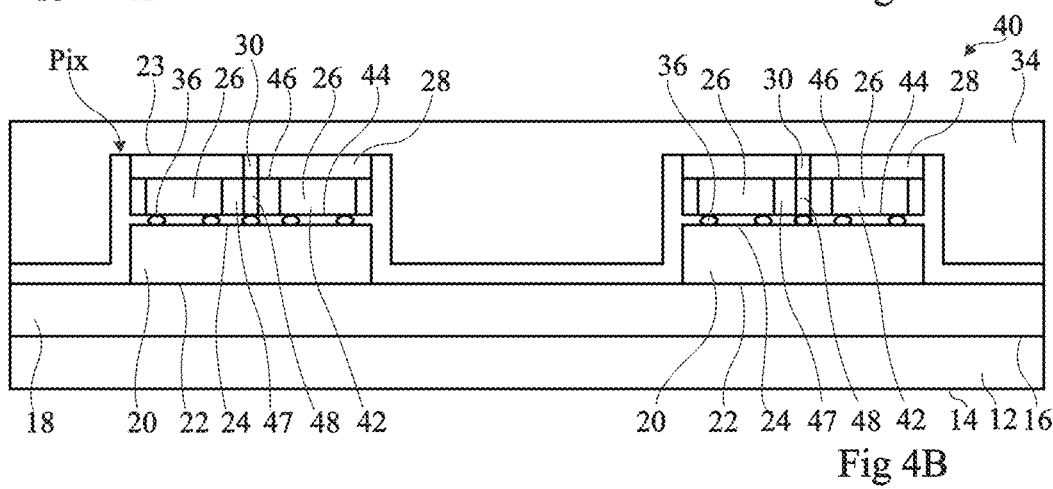

FIG. 4B is a view similar to FIG. 1 of another embodiment of an optoelectronic device 40 comprising all the elements of optoelectronic device 10, with the difference that, for each display pixel Pix, optoelectronic circuits 26 are integrated in a single optoelectronic circuit 42 covering upper surface 24 of the control circuit 20 of display pixel Pix and bonded to the upper surface 24 of control circuit 20, for example, by fusible conductive elements 36. Each optoelectronic circuit 42 comprises opposite lower and upper surface 44, 46, preferably parallel, lower surface 44 of optoelectronic circuit 42 being bonded to the upper surface 24 of control circuit 20. Optoelectronic circuit 42 comprises at least one through vertical connection 48 or TSV (through silicon via) formed for example in a portion 47 of optoelectronic circuit 42, which couples upper surface 46 to lower surface 44 and which is electrically insulated from the rest of optoelectronic circuit 42. Portion 47 may be made of an electrically-insulating material or of a semiconductor material. In this last case, TSV 48 is surrounded with an electrically-insulating layer. The upper surface 46 of each optoelectronic circuit 42 is covered with insulating portion 28. Insulating portion 28 is crossed by an electrically-conductive element 30 which is in contact with TSV 48. According to another embodiment, the power supply of control circuit 20 is achieved with other means than TSV 48.

According to an embodiment, each TSV 48 may comprise a core made of an electrically-conductive material, for example, polysilicon, tungsten, copper, aluminum, or a refractory metallic material, surrounded with an electrically-insulating layer.

Each optoelectronic circuit 42 comprises at least one first light-emitting diode capable of emitting the first radiation at the first wavelength and a second light-emitting diode capable of emitting the second radiation at the second wavelength. Each optoelectronic circuit 42 may further comprise at least one third light-emitting diode capable of emitting the third radiation at the third wavelength.

Figure 5:
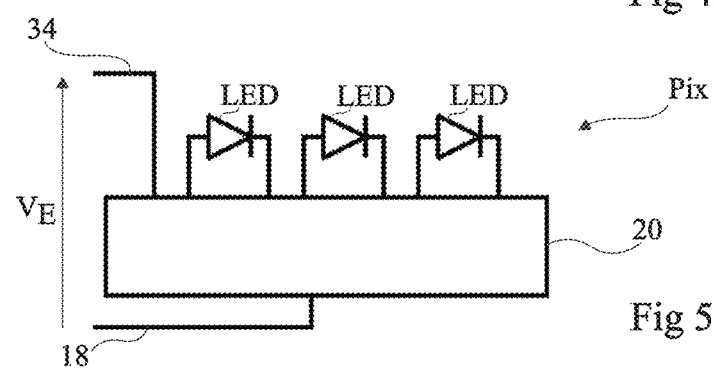
FIG. 5 is an equivalent electric diagram of a display pixel of the optoelectronic device shown in FIG. 4B.

FIG. 5 shows an equivalent electric diagram of display Pix shown in FIG. 3 in the case where each optoelectronic circuit 42 comprises three light-emitting diodes. In this embodiment, the two electrodes of each light-emitting diode LED of optoelectronic circuit 42 are connected to control circuit 20 of display pixel Pix. Control circuit 20 is connected between electrode layers 18 and 34 and receives voltage $V_E$. Circuit 20 controls the light-emitting diodes, LED, of optoelectronic circuit 26.

In the present embodiment, conductive layer 18 is in contact with all the display pixels Pix of optoelectronic circuit 10, 40, and conductive layer 34 is in contact with all the display pixels Pix of optoelectronic device 10, 40.

An embodiment of a method of manufacturing optoelectronic device 10 or 40 comprises manufacturing display pixels Pix and separately installing each display pixel Pix on electrode layer 18. According to an embodiment, electrode layers 18 and 34 being common to all display pixels Pix, the connection of display pixels Pix is simplified and it is not necessary for the placing of each display pixel Pix on electrode layer 18 to be performed with a high accuracy. This advantageously enables to implement faster techniques at decreased costs to arrange display pixels Pix on electrode layer 18. Further, since the light-emitting diodes are previously assembled on electronic circuit 20 of display pixel Pix, the number of transfers to be performed during the assembly of optoelectronic device 10 or 40 is decreased. In the present embodiment, each display pixel Pix may comprise a memory having an identifier of the pixel stored therein. The manufacturing method may comprise a calibration phase where the position of each display pixel Pix is recovered according to its identifier. In operation, data may then be transmitted to the pixels according to their identifier.

Figure 6:
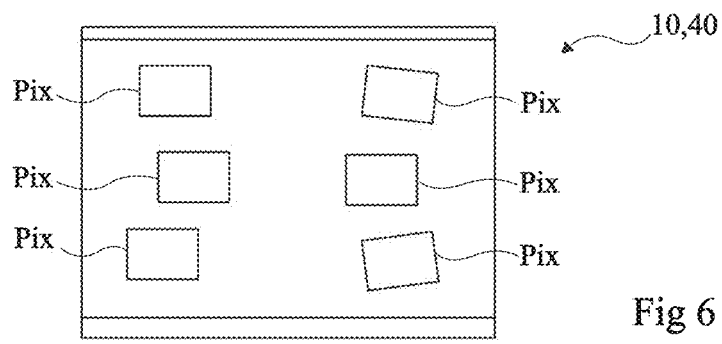
FIG. 6 is a partial simplified top view of the optoelectronic device shown in FIGS. 1 and 2 illustrating an advantage of the optoelectronic device manufacturing method.

FIG. 6 shows a simplified top view of optoelectronic device 10 or 40 illustrating the fact that it is possible for display pixels Pix not to be very accurately arranged, for example, perfectly aligned in rows and in columns and that certain display pixels Pix may be inclined with respect to the directions of the rows and of the columns.

In the previously-described embodiments, electrode layer 18 is connected to all the display pixels Pix and appears in the form of an uninterrupted layer extending over most of or even all of support 12.

For each display pixel Pix, control circuit 20 is capable of receiving control signals and of controlling, from the received control signals, the light-emitting diodes of the display pixel, particularly the shade, the saturation, and the brightness of the light emitted by the display pixel.

According to an embodiment, the control signals may be transmitted to the control circuits 20 of display pixels Pix by a modulation of voltage $V_E$.

Figure 7:
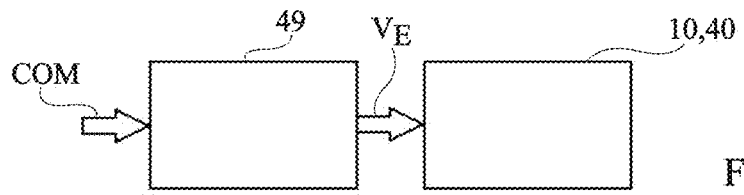
FIG. 7 is a diagram illustrating the control of the optoelectronic device shown in FIG. 1 or 4.

FIG. 7 very schematically shows a processing unit 49 receiving control signals COM and capable of supplying optoelectronic device 10 and 40 with a voltage $V_E$ for powering display pixels Pix, which is modulated with control signals COM. Processing unit 49 may correspond to a dedicated circuit or may comprise a processor, for example, a microprocessor or a microcontroller, capable of executing instructions of a computer program stored in the memory.

The control circuit 20 of each display pixel Pix may extract control signals COM by demodulation of voltage $V_E$. Control circuit 20 can then determine whether control signals COM are addressed thereto. As an example, an identifier may be associated with each display pixel Pix and the control signals COM obtained by demodulation of voltage $V_E$ may comprise the identifier of the display pixel for which the control signals are intended.

Advantageously, an active addressing of display pixels Pix may be performed. Indeed, each control circuit 20 may control the maintaining of the display properties, particularly the shade, the saturation, and the brightness, of the display pixel until it receives new control signals.

Figure 8A:
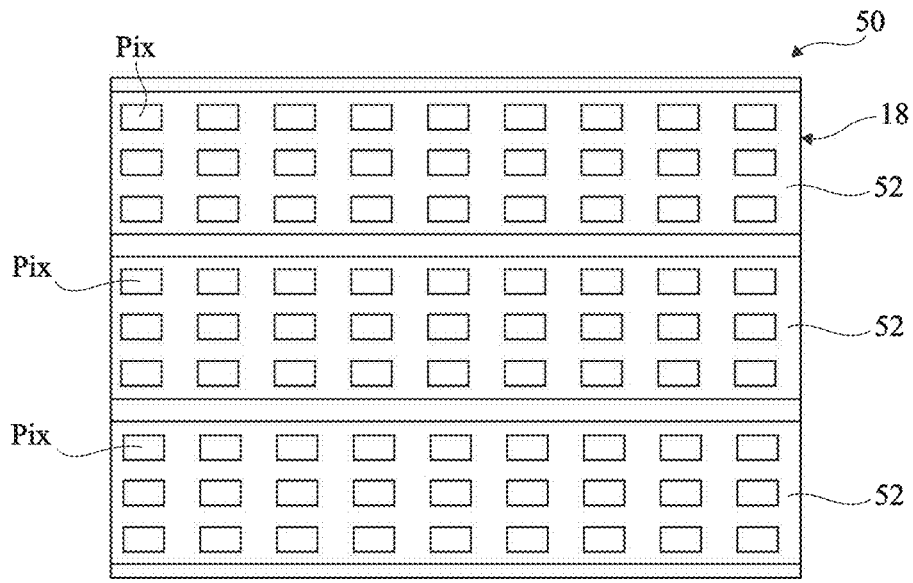
FIGS. 8A and 8B are partial simplified top views of other embodiments of an optoelectronic device.

FIG. 8A shows a simplified top view of another embodiment of an optoelectronic device 50 comprising all the elements of optoelectronic device 10 or 40, where electrode layer 18 is divided into parallel electrically-conductive strips 52 extending on support 12, three strips 52 being shown as an example in FIG. 8. As least one row of display pixels Pix is distributed on each conductive strip. Preferably, a plurality of rows of display pixels Pix are distributed on each conductive strip 52, three rows of display pixels Pix being shown per conductive strip 52 as an example in FIG. 8.

According to another embodiment, electrode layer 18 and/or electrode layer 34 may be divided into separate electrode portions. According to another embodiment, electrode layer 34 may also be divided into parallel electrically-conductive strips. When electrode layers 18 and 34 are each divided into strips, the strips of electrode layer 18 preferably have substantially the same dimensions as the strips of electrode layer 34 and each strip of electrode layer 34 substantially covers a single one of the strips of electrode layer 18. According to another embodiment, one of electrodes 18 or 34 may be common to display pixels Pix while the other electrode 18 or 34 is divided into parallel electrically-conductive strips. In the embodiment where electrode layers 18, 34 are divided into stacked strips sandwiching assemblies of display pixels, different control signals may be transmitted in parallel by modulating voltage $V_E$ differently for each assembly of display pixels. This enables to transmit in parallel the control signals for each assembly of display pixels Pix. This enables to decrease the modulation frequency of the electromagnetic radiation and/or to increase the rate of transmitted data.

Figure 8B:
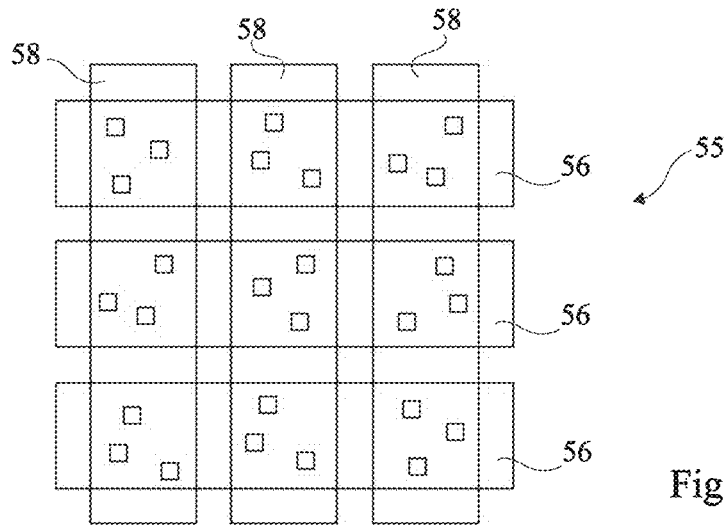

FIG. 8B is a partial simplified top view of another embodiment of an optoelectronic device 55 where electrode layer 18 is divided into conductive strips 56 extending along the row direction and where electrode layer 34 is divided into conductive strips 58 extending along the column direction, and called columns electrodes. At least one display pixel Pix is arranged at the intersection, in top view, between each row electrode 56 and each column electrode 58 and is connected to row electrode 56 and to column electrode 58. As an example, in FIG. 8B, three display pixels Pix are provided at the intersection, in top view, of each row electrode 56 and each column electrode 58 and form a pixel of the image to be displayed. When a plurality of display pixels Pix are provided for each pixel of the image to be displayed, this enables to have a redundancy in the case where one of display pixels Pix would be defective.

Figure 9:
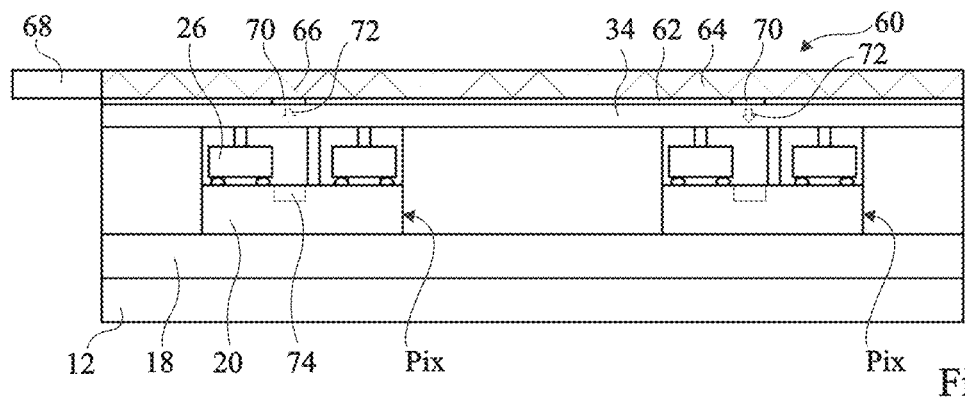
FIG. 9 is a partial simplified lateral cross-section view of another embodiment of an optoelectronic device.

FIG. 9 is a view similar to FIG. 1 of another embodiment of an optoelectronic device 60 comprising all the elements of optoelectronic device 10 and further comprising a stack of a first layer 62 and of a second layer 64 covering electrode layer 34. Layer 62 is made of a material having a refraction index greater than the refraction index of the material forming layer 64. Layers 62 and 64 are at least partially transparent to the radiations emitted by display pixels Pix. Layer 64 is for example made of glass, of $SiO_2$, of $Al_2O_3$, of $HfO_2$, of an organic material, for example, a polymer, particularly poly(methyl methacrylate) (PMMA). Layer 62 for example corresponds to an air film. Layer 64 forms a waveguide for an electromagnetic radiation 66, for example, in the visible range or outside of the visible range, preferably in a wavelength range between the infrared and ultraviolet range. Optoelectronic device 60 comprises an optoelectronic circuit 68 capable of emitting such a radiation 66 in layer 64. Optoelectronic circuit 68 may be located at the periphery of layer 64 and may emit radiation 66 in layer 64 from the lateral edge thereof. The infrared radiation is modulated to transport the previously-described control signals. According to an embodiment, optical coupling means 70 are provided between each display pixel Pix and waveguide 64 so that a fraction 72 of the radiation 66 guided in waveguide 64 escapes at the level of each display pixel Pix via coupling means 70. As an example, coupling means 70 correspond to a texturing provided on layer 64 and/or on layer 62 opposite each display pixel Pix to ensure the optical coupling between each display pixel Pix and layer 64. Coupling means 70 for example corresponds to a diffraction grating enabling to reflect part of the light propagating in waveguide 64 towards the associated display pixel Pix.

Each display pixel Pix comprises at least one sensor 74 capable of detecting the radiation emitted by optoelectronic circuit 68, for example, a photodiode or a photoresistor, the sensor supplying control circuit 20 with an electric signal for example representative of the intensity of radiation 72 received by display pixel Pix. Control circuit 20 is connected to the sensor and is capable of extracting the control signals based on the measurement signal supplied by the sensor.

According to an embodiment, the same electromagnetic radiation transporting the control signals is transmitted to all display pixels Pix. According to another embodiment, a plurality of waveguides may be provided, each waveguide being associated with an assembly of display pixels. According to another embodiment, optical continuity break areas may be formed in the waveguide to be able to address different groups of pixels.

Figure 10:
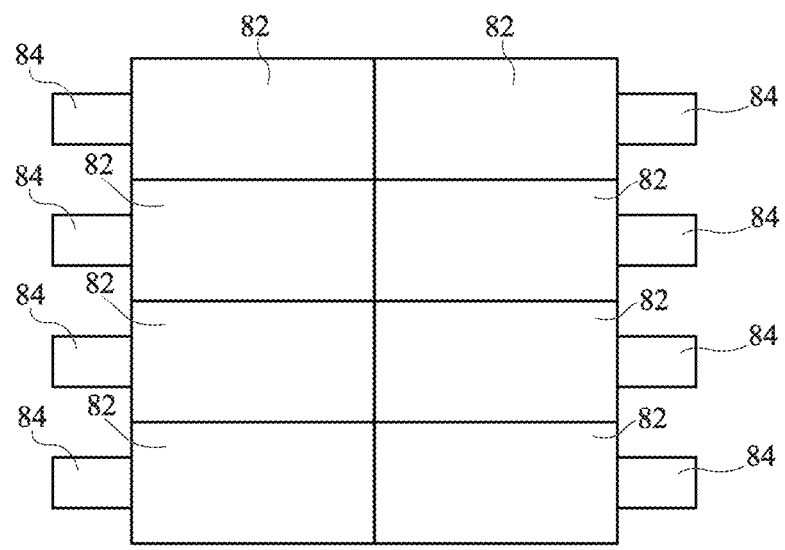
FIGS. 10 to 12 are partial simplified top views of other embodiments of optoelectronic devices.

FIG. 10 is a partial simplified top view of another embodiment of an optoelectronic device 80 comprising separate waveguides 82, or a single waveguide having optical discontinuities, each covering an assembly of display pixels, not shown. Optoelectronic device 80 further comprises optoelectronic circuits 84, each capable of emitting in the associated waveguide 82 an electromagnetic radiation in the non-visible range. This enables to transmit in parallel the control signals for each assembly of display pixels Pix. This enables to decrease the modulation frequency of the electromagnetic radiation and/or to increase the rate of transmitted data.

Figure 11:
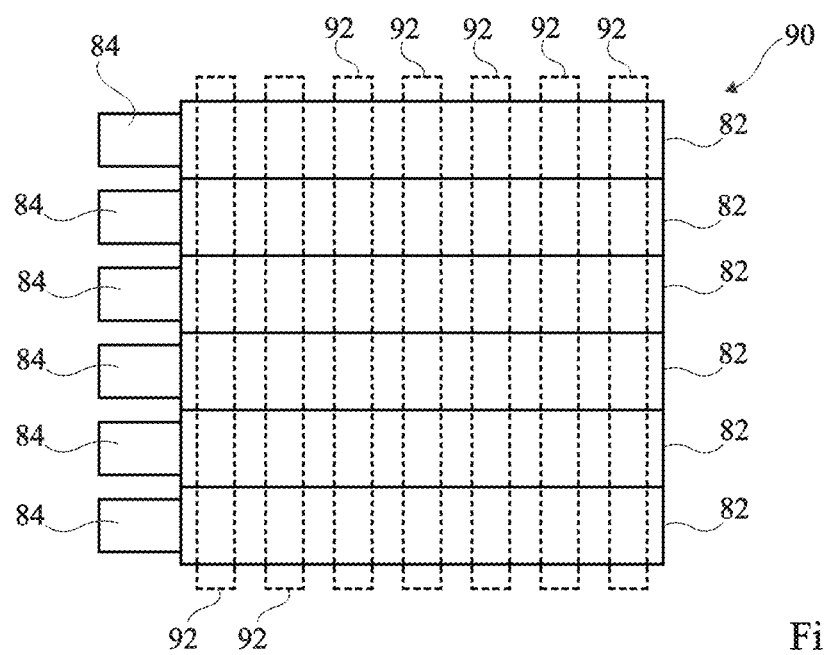

FIG. 11 is a partial simplified top view of another embodiment of an optoelectronic device 90 comprising all the elements of the device 80, each separate waveguide 82 covering at least one row of display pixels.

In the present embodiment, electrode layer 34 or electrode layer 18 is divided into conductive strips 92 extending along the column direction. Each conductive strip 92 is coupled to the display pixels of at least one pixel column.

An embodiment of a display pixel control method comprises a phase of selection of a display pixel or of a group of display pixels via electrodes 18, 92, followed by a phase of data transmission to some of the display pixels selected by one of waveguides 82. The selection phase may be performed by taking the conductive strip 92 coupled to the display pixels to be selected to a first potential while the other conductive strips 92 are maintained at a second potential different from the first potential. Only the display pixels which are selected are active and are capable of processing data transmitted by an electromagnetic radiation. The other display pixels are inactive and ignore the data which are transmitted by the radiation. The radiation transporting the data is then emitted into the waveguide 82 which covers the pixels of interest. Only the display pixels which have been selected and which are covered with waveguide 82 will process the data obtained by the detection of the radiation transmitted by waveguide 82.

According to an embodiment, each conductive strip 92 is coupled to the display pixels of a single column of display pixels and each waveguide 82 only covers one row of display pixels. The previously-described control method then enables to only select and transmit data to a single display pixel.

Figure 12:
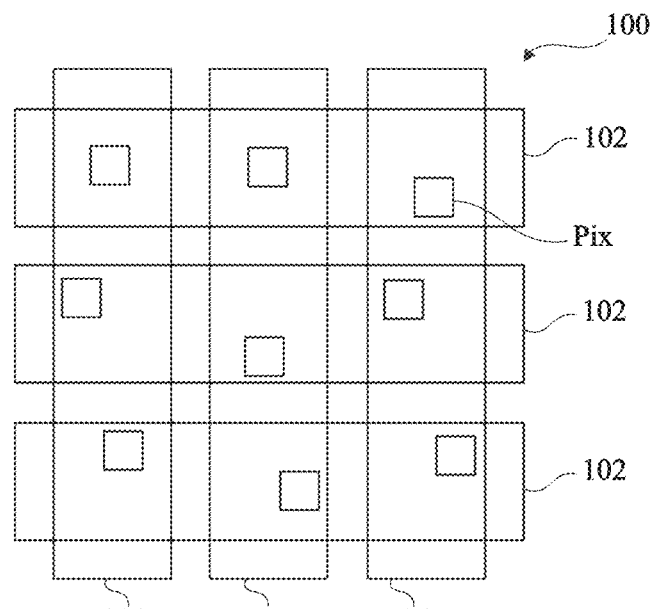

FIG. 12 is a partial simplified top view of another embodiment of an optoelectronic device 100 where electrode layer 18 is divided into conductive strips 102 extending along the row direction and called row electrodes, each conductive strip 102 being coupled to the display pixels Pix of a pixel row and where electrode layer 34 is divided into conductive strips 104 extending along the column direction and called column electrodes, each conductive strip 104 being coupled to the display pixels Pix of a pixel column.

As shown in FIG. 12, the width of each conductive strip 102 is greater than the dimension of display pixel Pix measured along the column direction and the width of each conductive strip 104 is greater than the dimension of display pixel Pix measured along the row direction. Thereby, for each row, it is possible for the display pixels Pix belonging to the row not to be perfectly aligned. Similarly, for each column, it is possible for the display pixels Pix belonging to the column not to be perfectly aligned.

An embodiment of a method of controlling a display pixel Pix comprises a phase of selection of the display pixel followed by a phase of data transmission to display pixel Pix.

Figure 13:
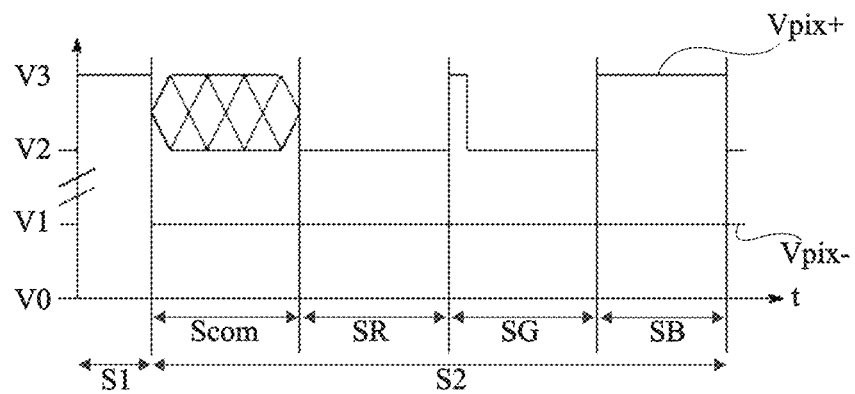
FIGS. 13 and 14 are timing diagrams respectively of the potentials applied to the conductive strips coupled to a display pixel to be controlled and of the voltage seen between the power supply terminals of the display pixel to be controlled.
Figure 14:
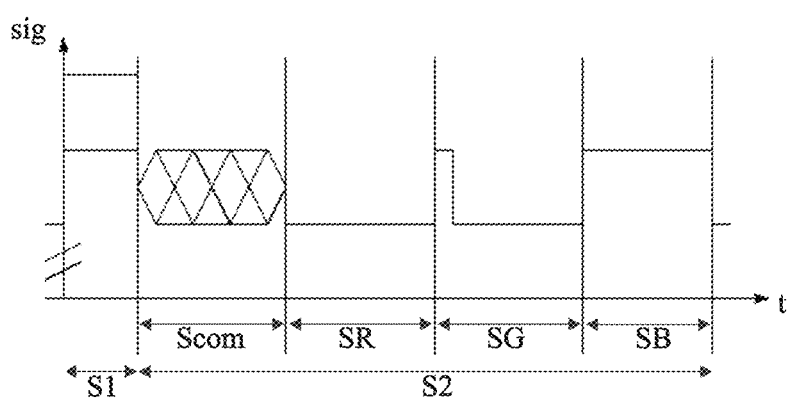

FIG. 13 is a timing diagram respectively of potentials Vpix+ and Vpix− respectively applied to the column and row electrodes coupled to a display pixel to be controlled and FIG. 14 is a timing diagram of voltage sig seen between the power supply terminals of the display pixel to be controlled.

According to an embodiment, optoelectronic circuit 100 is capable of varying the potential of each row electrode between two values V0 and V1, V1 being greater than V0, and of varying the potential of each column electrode between two values V2 and V3, V3 being greater than V2 and V2 being greater than V1. The difference between V3 and V2 may be equal to the difference between V1 and V0.

According to an embodiment, the control method comprises a phase S1 of selection of a display pixel to be controlled, followed by a phase S2 of data transmission to the selected display pixel.

Phase S1 comprises taking the row electrode coupled to the display pixel to be controlled to V0, the other row electrodes being left at V1, and taking the column electrode coupled to the display pixel to be controlled to V3, the other row electrodes being left at V2. The display pixel to be controlled then sees a voltage equal to V3−V0, while the other display pixels of the same row see a voltage equal to V2−V0, the other display pixels of the same column see a voltage equal to V3−V1 and the other display pixels of the other rows and columns see a voltage equal to V2−V1. All the display pixels other than the display pixel to be controlled see a voltage smaller than V3−V0.

Phase S2 comprises varying the potential of the column electrode of the display pixel to be controlled between V2 and V3 while leaving the row electrode of the display pixel to be controlled at V1. Thereby, the voltage seen by the display pixel to be controlled varies like the potential of the column electrode.

Each display pixel is capable of detecting whether, at phase S1, the power supply voltage which is applied thereto is greater than a threshold. When a display pixel detects that, at phase S1, the power supply voltage which is applied thereto is greater than a threshold, it is capable of processing the data, which are then transmitted during phase S2. When a display pixel detects that, at phase S1, the power supply voltage which is applied thereto is smaller than the threshold, it does not process the data, which are then transmitted thereto during phase S2.

The present embodiment enables to select a display pixel while maintaining the power supply of the other display pixels. The present embodiment further enables to transmit data to a single display pixel of an array of display pixels. Advantageously, all the display pixels of the array may correspond to identical optoelectronic devices. This enables to simplify the design of the display pixels and the assembly of the display pixels. The present embodiment further enables to simultaneously transmit data to a plurality of display pixels, or even to simultaneously transmit data to all the display pixels. Further, the fact for the potential of one of the electrodes to remain constant during phase S2 advantageously enables the display pixel to have a constant potential reference during phase S2, which simplifies the processing of the signals by the display pixel.

The data transmitted during phase S2 may be binary data and/or analog data. The transmitted data may be modulated. It may be a frequency, amplitude, phase modulation, or a pulse width modulation.

As an example, in FIGS. 13 and 14, phase S2 successively comprises a sub-phase Scom corresponding to the transmission of binary data, a phase SR corresponding to the transmission of a control signal for a first display sub-pixel, for example, the red display sub-pixel, a phase SG corresponding to the transmission of a control signal for a second display sub-pixel, for example the green display sub-pixel, and a phase SB corresponding to the transmission of a control signal for a third display sub-pixel, for example, the blue display sub-pixel. As a variation, sub-phase Scom may be omitted.

According to an embodiment, each sub-phase SR, SG, and SB comprises transmitting a voltage pulse having a duration representative of the desired duration of activation of the considered display sub-pixel.

Figure 15:
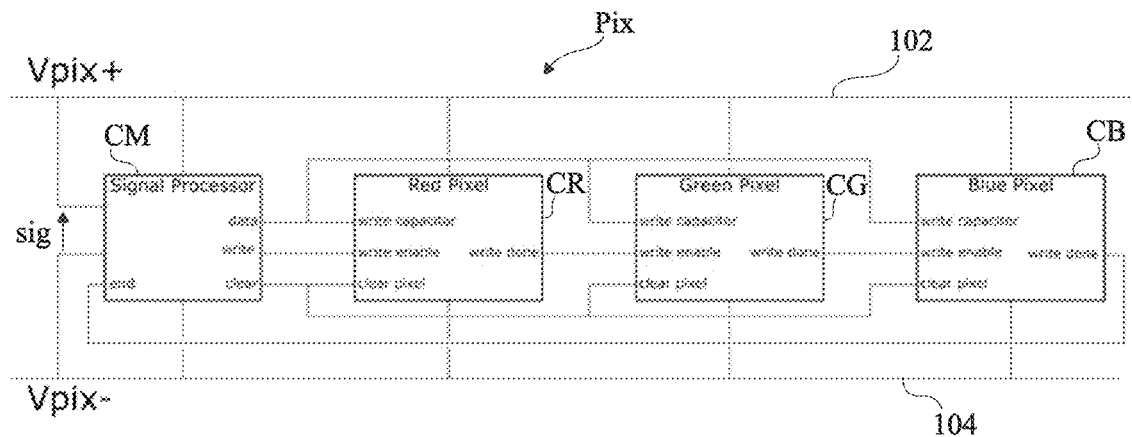
FIG. 15 shows an equivalent electric diagram of an embodiment of a display pixel.

FIG. 15 shows an equivalent electric diagram of an embodiment of display pixel Pix.

Display pixel Pix is coupled to one of the column electrodes 104 which is at potential Vpix+ and to one of the row electrodes 102 which is at potential Vpix−.

Display pixel Pix comprises a processing unit CM (Signal Processor), a unit CR for controlling a first display sub-pixel (Red Pixel), for example, the red display sub-pixel, a unit CG for controlling a second display sub-pixel (Green Pixel), for example, the green display sub-pixel, and a unit CB for controlling a third display sub-pixel (Blue Pixel), for example, the blue display sub-pixel. The electronic components of processing unit CM are located at the level of control circuit 20. The electronic components of units CR, CG, CB may be located at the level of control circuit 20 and/or at the level of optoelectronic circuits 26.

Each unit CM, CR, CG, and CB is coupled to the column and row electrodes 102, 104 associated with potentials Vpix+ and Vpix− for their electric power supply. Control circuit CM receives the potential values Vpix+ and Vpix− and a signal end as input signals and outputs three binary signals data, write, and clear. According to an embodiment, units CR, CG, and CB are identical and each unit CR, CG, and CB comprises three inputs write capacitor, write enable, and clear pixel and an output write done. As a variation, unit CB may be different from units CR and CG and may comprise no output write done. Inputs write capacitor of each unit CR, CG, and CB each receive signal data. Inputs clear pixel of each unit CR, CG, and CB each receive signal clear. Input write enable of unit CR receives signal write. Input write enable of unit CG is coupled to output write done of unit CR and input write enable of unit CB is coupled to output write done of unit CG. In the embodiment illustrated in FIG. 15, output write done of unit CB supplies the signal end received by unit CM.

Figure 16:
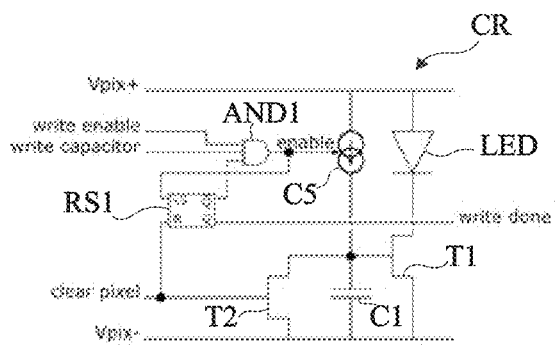
FIG. 16 shows an equivalent electric diagram of a portion of the display pixel of FIG. 15.

FIG. 16 shows an equivalent electric diagram of an embodiment of unit CR, where units CG and CB may be identical.

According to an embodiment, unit CR comprises a light-emitting diode LED having its anode coupled to the electrode at potential Vpix+ and having its cathode coupled to a control terminal among the drain or the source of a MOS transistor T1 and having its other control terminal coupled to the electrode at potential Vpix−. Unit CR further comprises a capacitor C1 having an electrode coupled to the gate of transistor T1 and having its other electrode coupled to the electrode at potential Vpix−. Unit CR further comprises a MOS transistor T2 having a control terminal among the drain or the source coupled to the gate of transistor T1 and having its other control terminal coupled to the electrode at potential Vpix−. The gate of transistor T2 is coupled to input clear pixel. Unit CR further comprises a three-input AND logic gate AND1 having two inputs corresponding to inputs write enable and write capacitor of unit CR. Logic gate AND1 supplies a control signal enable to a current source CS having a terminal coupled to the electrode at potential Vpix+ and having its other terminal coupled to the gate of transistor T1. Unit CR further comprises an RS flip-flop RS1 having its S input, sensitive to falling edges, receiving signal enable, having its R input coupled to input clear pixel of unit CR, and having its $\overline{Q}$ output coupled to the third input of logic gate AND1. The Q output of flip-flop RS1 is coupled to output write done of unit CR. In operation, the intensity of the current flowing through light-emitting diode LED depends on the conduction of transistor T1 which is set by the voltage across capacitor C1. The higher the voltage across capacitor C1, the more transistor T1 is conductive.

Figure 17:
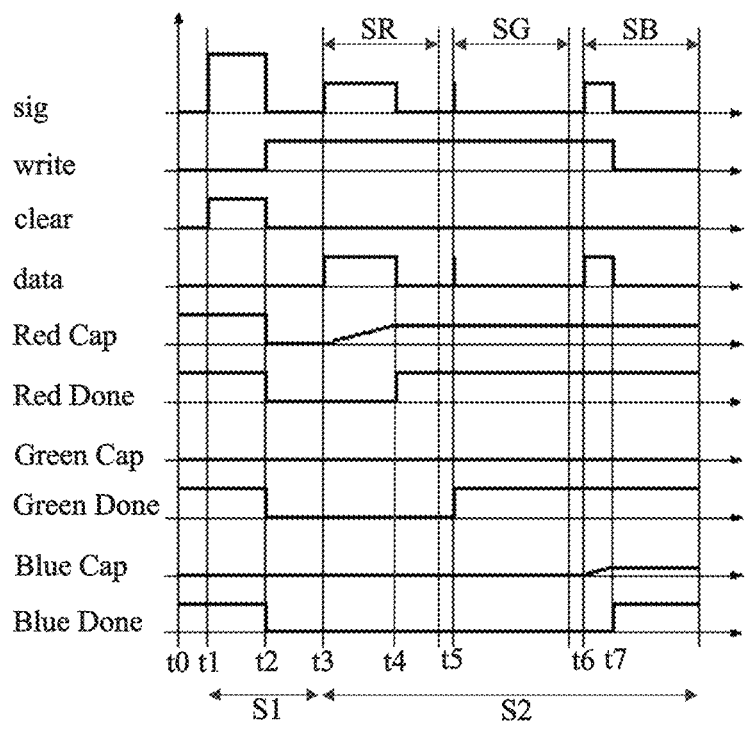
FIG. 17 shows a timing diagram of signals during the operation of the display pixel of FIG. 15.

FIG. 17 shows a timing diagram of signals during a cycle of control of the display pixel of FIG. 15. Call t0, t1, t2, t3, t4, t5, t6, and t7 successive times. Output write enable of unit CR supplies signal Red Done. Output write enable of unit CG supplies signal Green Done. Output write enable of unit CB supplies signal Blue Done.

Signals Red Cap, Green Cap, and Blue Cap respectively correspond to the voltages across capacitors C1 respectively of units CR, CG, and CB. Signal sig corresponds to the difference between potentials Vpix+ and Vpix−. Signal sig may take three discrete values "0", "1", and "2".

In the present embodiment, signal data is equal to signal sig outside of the selection phase and signal write is set to "1" during the phases of control of the display sub-pixels.

At time t0, signals Red Done, Green Done, and Blue Done are at "1", signal sig is at "0", and signal clear is at "0". At time t1, signal sig switches from "0" to "2". Unit CM detects that the display pixel is selected and sets signal clear to "1". At time t2, signal sig switches to "0". Unit CM then sets signal write to "1" and signal clear to "0". This initializes flip-flops RS1 of units CR, CG, and CB, sets signals Red Done, Green Done, and Blue Done to "0", and empties capacitors C1 of units CR, CG, and CB, setting voltages Red Cap, Green Cap, and Blue Cap to 0. At time t3, the phase of control of the red display sub-pixel starts. In the present embodiment, the red display sub-pixel is activated and signal sig switches to "1". Signal data is equal to signal sig so that capacitor C1 of unit CR is charged by current source CS until time t4 at which signals sig and data switch to "0". Signal Red Done then switches to "1". At time t5, the phase of control of the green display sub-pixel starts. In the present embodiment, the green display sub-pixel is not activated and signal sig switches to "1" for a very short time. Capacitor C1 of unit CG is not substantially charged and signal Green Done then switches to "1". At time t6, the phase of control of the blue display sub-pixel starts. In the present embodiment, the blue display sub-pixel is activated and signal sig switches to "1". Signal data is equal to signal sig so that capacitor C1 of unit CR is charged by current source CS until time t7 at which signals sig and data switch to "0". Signal Blue Done then switches to "1".

Figure 18:
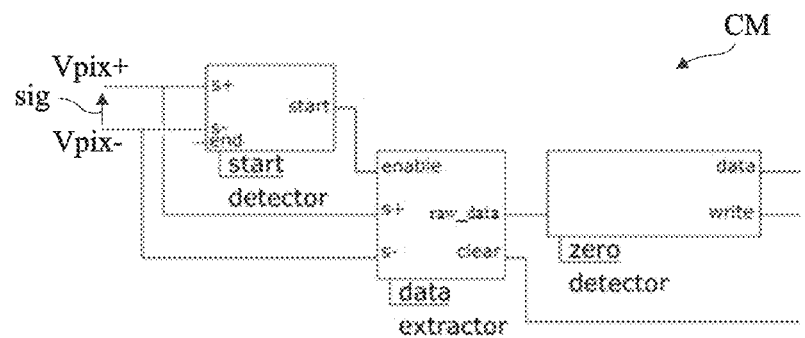
FIGS. 18 to 21 show equivalent electric diagrams of portions of the display pixel of FIG. 15.
Figure 20:
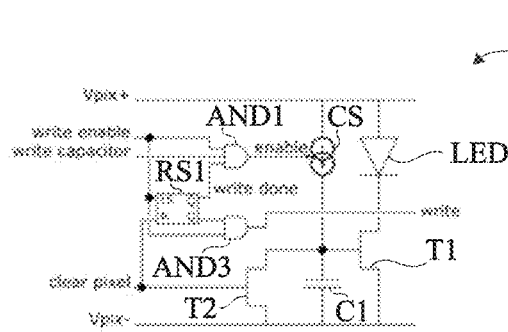
Figure 21:
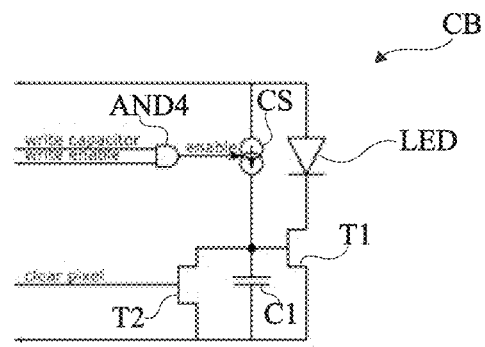

FIG. 18 shows an equivalent electric diagram of another embodiment of unit CM adapted to the case where signal end is supplied by output write of unit CG, units CR, CG for example corresponding to the electric diagram shown in FIG. 20 described hereafter and unit CB for example corresponding to the electric diagram shown in FIG. 21 described hereafter. In the present embodiment, during transmission phase S2, signal data is equal to signal sig delayed by a given duration ΔT and signal write is equal to signal sig.

Unit CM comprises a block start detector comprising an input s+ coupled to the electrode at potential Vpix+ and an input s− coupled to the electrode at potential Vpix− and supplying a binary signal start. Block start detector is capable of detecting that signal sig, which corresponds to the voltage between inputs s+ and s−, switches to "2" and is capable of setting signal start to "1" when signal sig switches back to "0".

Unit CM comprises a block data extractor comprising an input s+ coupled to the electrode at potential Vpix+, an input s− coupled to the electrode at potential Vpix−, and an input enable receiving signal start. The block supplies signal clear and signal raw_data which is extracted from signal sig, and which for example corresponds to a binary version of signal sig outside of the selection phase.

Unit CM comprises a block zero detector receiving signal raw_data and supplying signal write equal to signal raw_data and supplying signal data, which is equal to signal raw_data for which the duration of each pulse at "1" is decreased by duration ΔT, the beginning of each pulse being delayed by duration ΔT and the end of each pulse being unmodified so that, if the pulse of signal raw_data is shorter than duration ΔT, signal data comprises no corresponding pulse.

Figure 19:
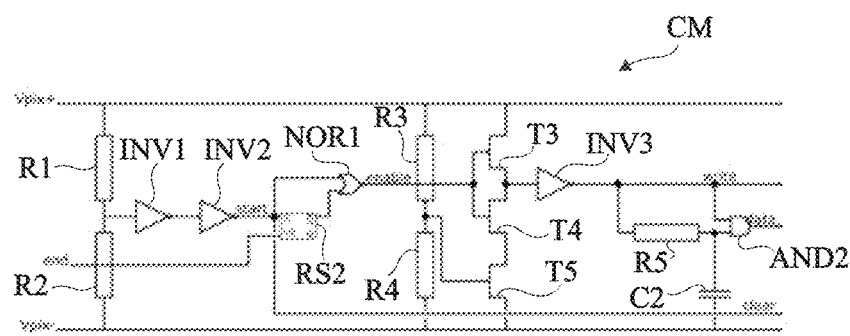

FIG. 19 shows a more detailed electric diagram of an embodiment of unit CM shown in FIG. 18.

Unit CM comprises a first voltage dividing bridge comprising two resistors R1 and R2 series-assembled between the electrode at potential Vpix+ and the electrode at potential Vpix−. The midpoint of the first dividing bridge supplies a succession of two inverters INV1 and INV2 in series, the second inverter INV2 supplying signal start. Unit CM comprises an RS flip-flop RS2 having its S input receiving signal start and having input R, sensitive to the falling edges, receiving a signal end. Signal end is supplied by output write done of unit CG as described in FIG. 20. Unit CM comprises a NOR logic gate NOR1 having its first input receiving signal start, having its second input coupled to the $\overline{Q}$ output of flip-flop RS2 and supplying signal enable.

Unit CM comprises a second voltage dividing bridge comprising two resistors R3 and R4 series-assembled between the electrode at potential Vpix+ and the electrode at potential Vpix−. Unit CM comprises three MOS transistors T3, T4, and T5 series-assembled between the electrode at potential Vpix+ and the electrode at potential Vpix−. Transistor T3 has a P channel and transistors T4 and T5 have an N channel. The gates of transistors T3 and T4 receive signal enable. The midpoint of the second dividing bridge powers the gate of transistor T5.

The source of transistor T3 powers an inverter INV3, which supplies signal write. Unit CM comprises a two-input AND logic gate AND2 having its first input receiving signal write. Unit CM comprises a resistor R5 assembled between the output of inverter INV3 and the second input of gate AND2. Unit CM comprises a capacitor C2 having an electrode coupled to the second input of gate AND2 and having its other electrode coupled to the electrode at potential Vpix−. The output of gate AND2 supplies signal data.

FIG. 20 shows an equivalent electric diagram of another embodiment of unit CR, where unit CG may be identical. Unit CR comprises all the elements of the unit shown in FIG. 16, with the difference that the S input of flip-flop RS1 is coupled to input write enable of unit CR and in that it comprises a two-input AND logic gate AND3 having its first input receiving the Q signal, having its second input coupled to input write enable, and having its output coupled to output write done.

FIG. 21 shows an equivalent electric diagram of another embodiment of unit CB. Unit CB comprises all the elements of the unit shown in FIG. 16, with the difference that flip-flop RS1 is not present and that three-input logic gate AND1 is replaced with a two input logic gate AND4 having its first input coupled to input write capacitor of unit CB and having its second input coupled to input write enable of unit CB and supplying signal enable.

Figure 22:
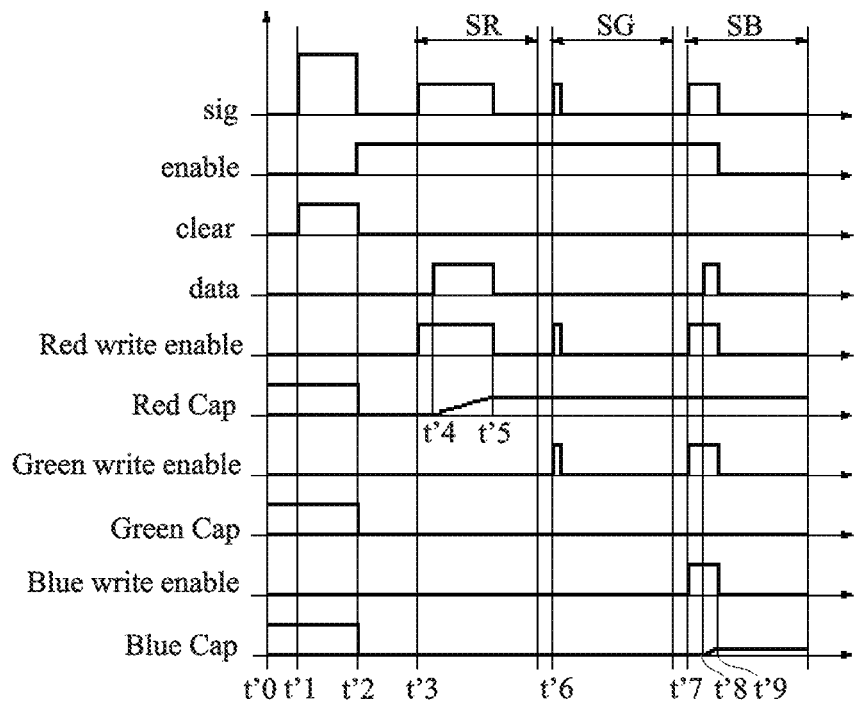
FIG. 22 shows a timing diagram of signals during the operation of the display pixel having a control unit in accordance with the embodiment shown in FIG. 18.

FIG. 22 shows a timing diagram of signals during a cycle of control of the display pixel of FIG. 18. Call t'0, t'1, t'2, t'3, t'4, t'5, t'6, t'7, t'8, and t'9 successive times. Signals Red write enable, Green write enable, and Blue write enable correspond to the signals respectively received by inputs write enable of units CR, CG, and CB.

The signals vary at times t'0, t'1, t'2 in the same way as what has been previously described for signals t0, t1, and t2. At time t'3, the red display sub-pixel control phase starts. In the present embodiment, the red display sub-pixel is activated and signal sig switches to "1". Signal data is equal to signal sig delayed by a duration ΔT so that the capacitor C1 of unit CR is charged by current source CS from time t'4 to time t'5 at which signals sig, data, and Red write enable switch to "0". Signal write done of unit CR then becomes equal to signal Red write enable. At time t'6, the green display sub-pixel control phase starts. In the present embodiment, the green display sub-pixel is not activated and signal sig switches to "1" for a duration shorter than ΔT. Signal write and Green write enable also switch to "1" for this very short duration. However, signal data remains at "0" so that capacitor C of unit CG is not charged. Signal write done of unit CR then becomes equal to signal Green write enable. At time t'7, the blue display sub-pixel control phase starts. In the present embodiment, the blue display sub-pixel is activated and signal sig switches to "1". Signal data is equal to signal sig delayed by a duration ΔT so that the capacitor C of unit CB is charged by current source CS from time t'8 to time t'9 at which signals sig, data, Red write enable, Green write enable, and Blue write enable switch to "0".

According to an embodiment, the display pixel may be formed with less than 150 MOS transistors, 5 resistors, and 4 capacitors. It may thus occupy a small surface area.

Figure 23:
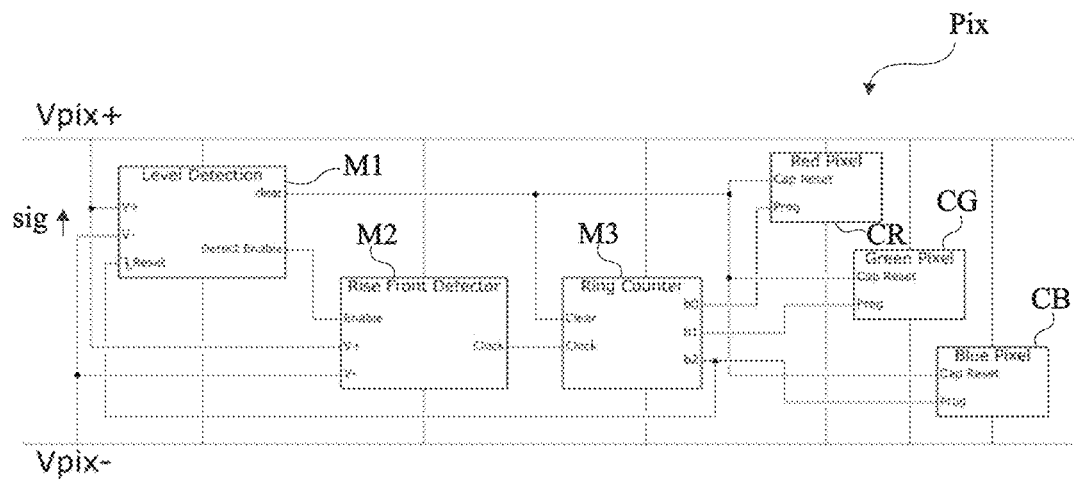
FIG. 23 shows an equivalent electric diagram of another embodiment of a display pixel.

FIG. 23 shows an electric diagram of another embodiment of display pixel Pix.

Display pixel Pix is coupled to one of the column electrodes 102 which is at potential Vpix+ and to one of the row electrodes 104 which is at potential Vpix−.

Display pixel Pix comprises a level detection unit M1, a rising edge detector M2, and a counter M3 (Ring Counter), and display sub-pixel control units CR, CG, and CB. The electronic components of units M1, M2, and M3 are located at the level of control circuits 20. The electronic components of units CR, CG, CB may be located at the level of control circuit 20 and/or at the level of optoelectronic circuits 26.

Each unit M1, M2, M3, CR, CG, and CB is coupled to the column and row electrodes 102, 104 associated with potentials Vpix+ and Vpix− for their electric power supply.

Unit M1 receives potential values Vpix+ and Vpix− as input signals respectively at inputs V+ and V− and a binary signal Reset and supplies a binary signal Detect enable and a binary signal Clear. Unit M2 receives potential values Vpix+ and Vpix− as input signals respectively at inputs V+ and V− and binary signal Detect enable at an input Enable and supplies a binary signal Clock. Unit M3 receives binary signal Clock and supplies three binary signals b0, b1, and b2. The falling edge of b2 resets unit M1.

Each unit CR, CG, and CB comprises an input Cap reset and an input Prog. Input Cap reset of each unit CR, CG, and CB receives signal Detect enable. Input Prog of unit CR receives signal b0, input Prog of unit CG receives signal b1, and input Prog of unit CB receives signal b2.

In the present embodiment, unit M1 is capable of detecting that the display pixel is selected by an increase of signal sig. When a selection has been detected, unit M2 detects the rising edges of signal sig. The capacitors of units CR, CG, and CB are sequentially charged, the switching from one unit to another being triggered by a falling edge of signal sig. At the beginning of each sequence, the capacitors of units CR, CG, and CB are discharged.

Figure 24:
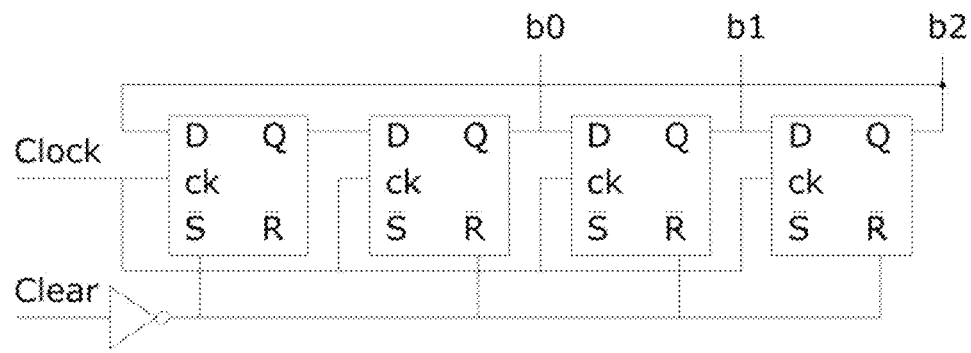
FIGS. 24 and 25 show equivalent electric diagrams of portions of the display pixel of FIG. 23.

FIG. 24 shows an embodiment of unit M3. Unit M3 comprises a succession of four D-type flip-flops with asynchronous /S and /R inputs, D1, D2, D3, and D4. The ck input of each flip-flop D1, D2, and D3 receives signal Clock. The Q output of flip-flop D1 is coupled to the D input of flip-flop D2, the Q output of flip-flop D2 is coupled to the D input of flip-flop D3, and the Q output of flip-flop D3 is coupled to the D input of flip-flop D4. The output of flip-flop D1 is at "1" at the setting of the counter while the outputs of the other flip-flops are at logic state "0". Bit b0 corresponds to the signal supplied by the Q output of flip-flop D2, bit b1 corresponds to the signal supplied by the Q output of flip-flop D3, and bit b2 corresponds to the signal supplied by the Q output of flip-flop D4. Signal Clear originating from unit M1 is supplied to inverter INV9 and powers the /S input of flip-flop D1 as well as the /R inputs of flip-flops D2, D3, and D4.

Figure 25:
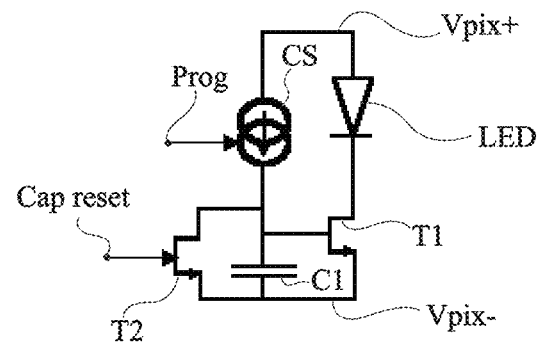

FIG. 25 shows an embodiment of unit CR. Units CG and CB may have the same structure. Unit CR has the same structure as unit CR shown in FIG. 16, with the difference that logic gate AND1 and flip-flop RS1 are not present, that current source CS is controlled by the signal received at input Prog of unit CR, and that the gate of transistor T2 is controlled by the signal received at input Cap_reset of unit CR.

Figure 26:
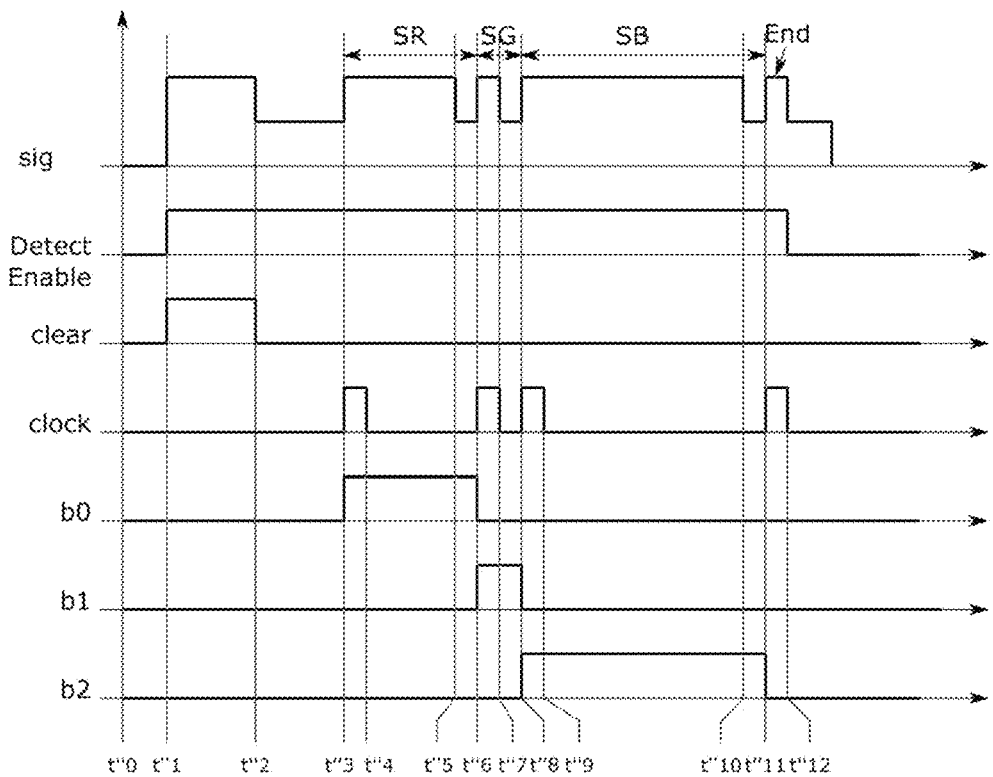
FIG. 26 shows a timing diagram of signals during the operation of the display pixel of FIG. 23.

FIG. 26 shows a timing diagram of signals during a cycle of control of the display pixel of FIG. 23. Call t″0, t″1, t″2, t″3, t″4, t″5, t″6, t″7, t″8, t″9, t″10, t″11, and t″12 successive times.

At time t″0, signals sig, Cap_reset, detect enable, up, b0, b1, and b2 are at "0". At time t″1, signal sig switches from "0" to "2". Unit M1 detects that the display pixel is selected and sets signal Clear and signal detect enable to "1". At time t″2, signal sig switches to "1" and unit M1 switches signal Clear to "0". At time t″3, red display sub-pixel control phase SR starts. In the present embodiment, the red display sub-pixel is activated and signal sig switches to "2". Signal clock is set to "1" from time t″3 to time t″4. Signal b0 is set to "1" at time t″3. At time t″5, signal sig switches to "1". At time t″6, signal sig switches to "2", phase SG of control of the green display sub-pixel starts while the red sub-pixel control phase is ended. In the present embodiment, the green display sub-pixel is activated. Signal clock is set to "1" from time t″6 to time t″7. Signal b1 is set to "1" at time t″6. Signal b0 is set to "0" at time t″6. At time t″8, signal sig switches to "2", phase SB of control of the display sub-pixel starts. In the present embodiment, the blue display sub-pixel is activated. Signal clock is set to "1" from time t″8 to time t″9. Signal b2 is set to "1" at time t″8. Signal b1 is set to "0" at time t″8. At time t″10, signal sig switches to "1". At time t″11, signal sig is set to "2". The end of the transaction is notified. At time t″11, signal clock is set to "1" and signal b2 is set to "0", phase SB of control of the blue sub-pixel ends. At time t″12, signal sig switches to "1" and then to "0".

According to an embodiment, the display pixel may be formed with less than 150 MOS transistors, 3 resistors, and 4 capacitors. It may thus occupy a small surface area.

To optimize the data transfer conditions, all the embodiments might integrate a function to turn off the pixels in the addressed row or column for the duration of the communication, which would limit the load to be driven during the data transfer. The addition of such a functionality may be performed by decreasing potential different Vpix+−Vpix−.

FIGS. 27A to 27H are partial simplified cross-section views of structures obtained at successive steps of another embodiment of a method of manufacturing the optoelectronic device of FIG. 10 shown in FIGS. 1 and 2.

Figure 27A:
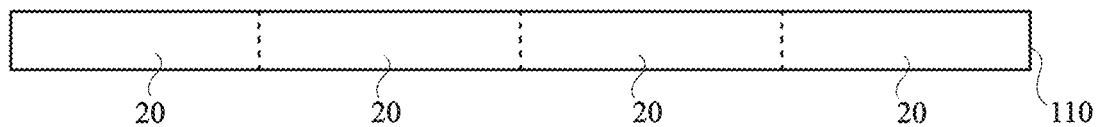
FIGS. 27A to 27I are partial simplified lateral cross-section views of structures obtained at successive steps of another embodiment of a method of manufacturing the optoelectronic device shown in FIGS. 1 and 2.

FIG. 27A shows the structure obtained after the manufacturing of an electronic circuit 110 comprising a plurality of the desired control circuit 20, four control circuits 20 being shown as an example in FIG. 27A. The method of manufacturing electronic circuit 110 may comprise conventional steps of an integrated circuit manufacturing method.

Figure 27B:
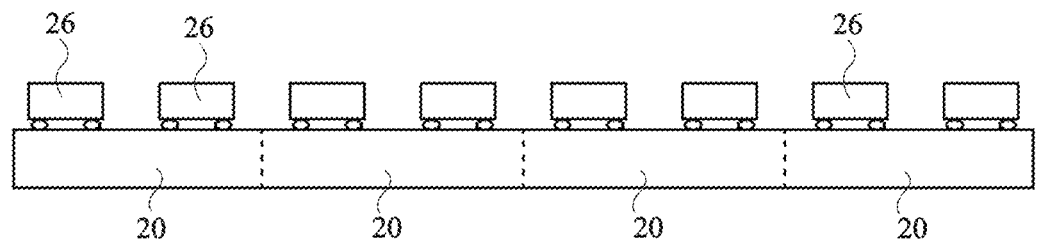

FIG. 27B shows the structure obtained after having affixed the optoelectronic circuits 26 onto electronic circuit 110. The methods of assembly of optoelectronic circuits 26 on electronic circuit 110 may comprise soldering operations.

Figure 27C:
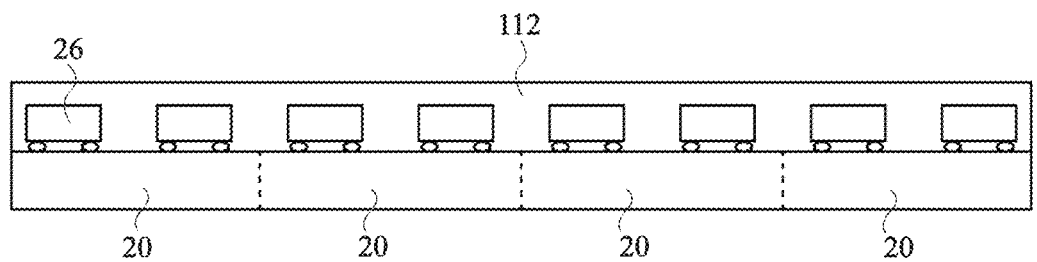

FIG. 27C shows the structure obtained after the deposition of an electrically-insulating layer 112 covering optoelectronic circuits 26 and electronic circuit 110 between optoelectronic circuits 26. Insulating layer 112 is made of the same material as the previously-described insulating portions 28. Insulating layer 112 may be made of $SiO_2$, SiN, $Al_2O_3$, $ZrO_2$, $HfO_2$ or of any other dielectric material deposited by chemical vapor deposition (CVD), plasma-enhanced chemical vapor deposition (PECVD), atomic layer deposition (ALD), or cathode sputtering.

Figure 27D:
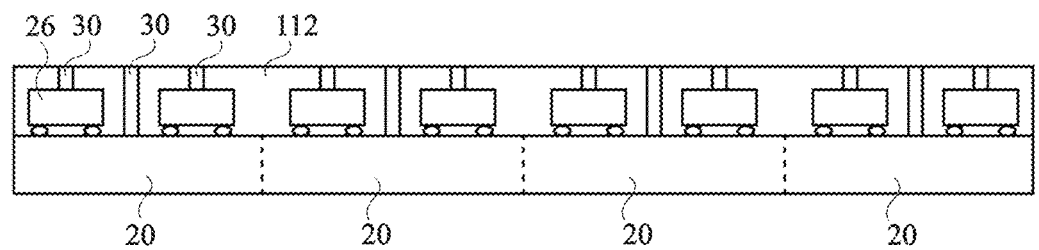

FIG. 27D shows the structure obtained after the forming of conductive elements 30 in insulating layer 112. Conductive elements 30 may be formed by etching openings in insulating layer 112 stopping on optoelectronic circuits 26 and/or control circuits 20, by depositing a conductive layer over the entire obtained structure, and by removing the portion of the conductive layer outside of the openings.

Figure 27E:
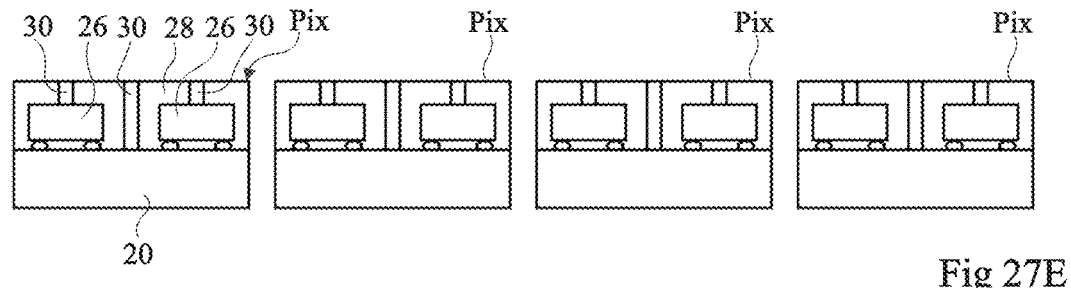

FIG. 27E shows the structure obtained after the sawing of electronic circuit 110 and of insulating layer 112 to delimit display pixels Pix.

Figure 27F:
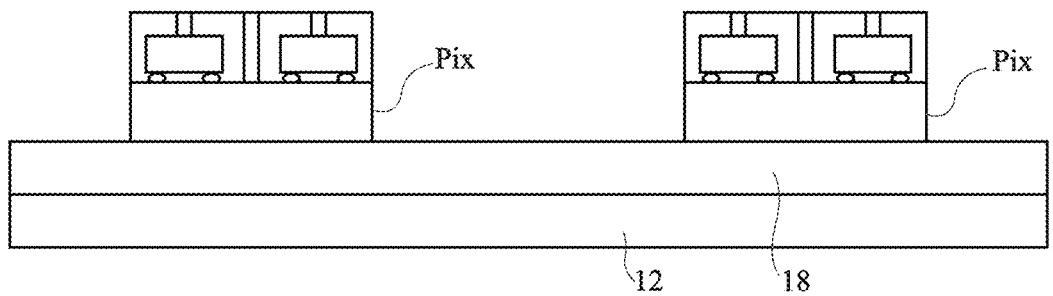

FIG. 27F shows the structure obtained after having affixed display pixels Pix to electrode layer 18 which has been previously deposited on support 12. As an example, each display pixel Pix may be affixed to electrode layer 18 by molecular bonding or via a bonding material, particularly, an electrically-conductive epoxy glue.

Figure 27G:
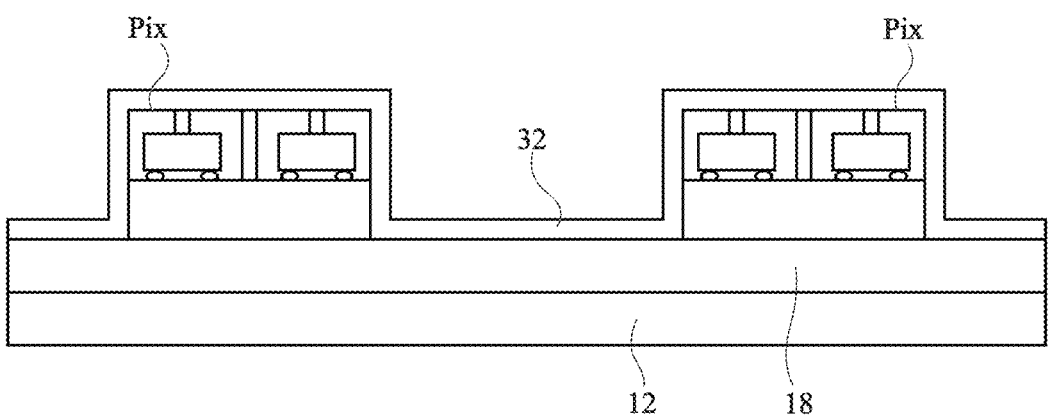

FIG. 27G shows the structure obtained after having formed insulating layer 32 on display pixels Pix and on electrode layer 18 between display pixels Pix. Insulating layer 32 may be $SiO_2$, SiN, $Al_2O_3$, $ZrO_2$, $HfO_2$ or any other dielectric material.

Figure 27H:
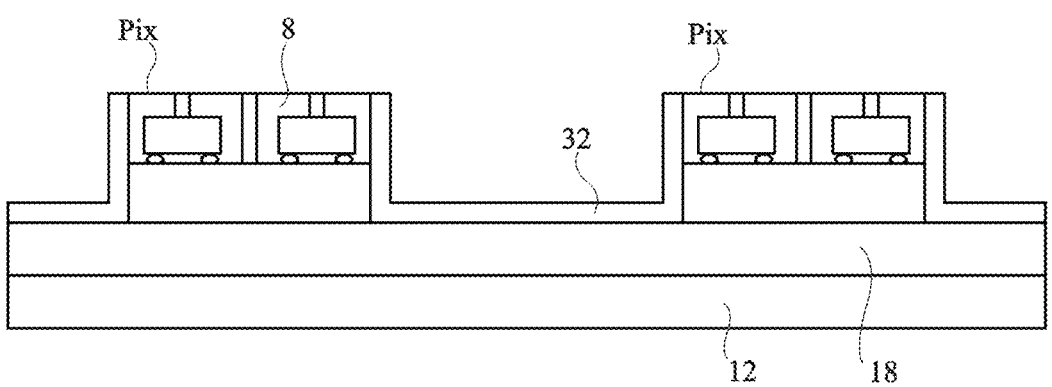

FIG. 27H shows the structure obtained after having removed insulating layer 32 from the top of each display pixel Pix. According to an embodiment, the removal may be carried out by chem.-mech. polishing (CMP) with a stop on insulating portions 28. According to another embodiment, this may be obtained by chemical etching of insulating layer 32. According to another embodiment, the removal may be carried out by a so-called lift-off method comprising the deposition of a sacrificial layer at the top of each display pixel Pix before the deposition of insulating layer 32 and, after the deposition of insulating layer 32, the removal of the sacrificial layer and of the portion of insulating layer 32 covering the sacrificial layer.

Figure 27I:
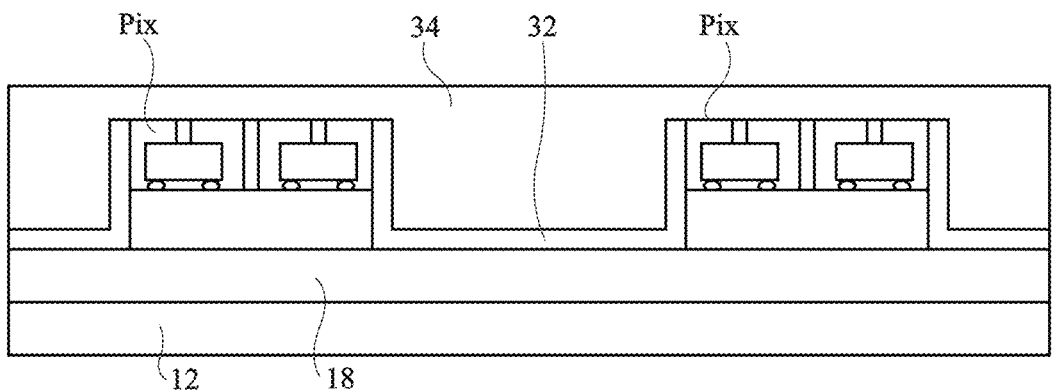

FIG. 27I shows the structure obtained after the forming of electrode layer 34. Electrode layer 34 may be made of TCO deposited by CVD, PECVD, ALD, cathode sputtering, or evaporation.

FIGS. 28A to 28D are partial simplified cross-section views of structures obtained at successive steps of another embodiment of a method of manufacturing the optoelectronic device shown in FIG. 4B.

Figure 28A:
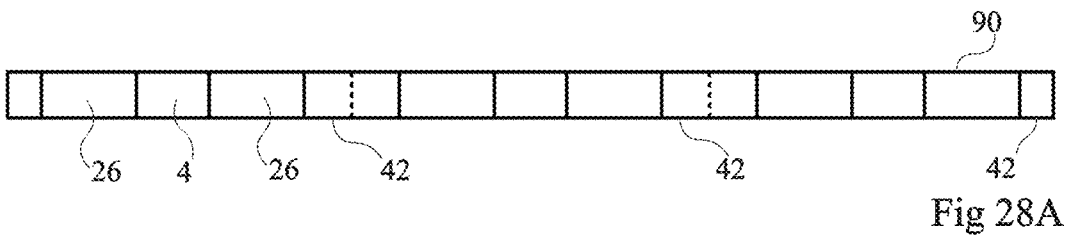
FIGS. 28A to 28D are partial simplified lateral cross-section views of the structures obtained at successive steps of another embodiment of a method of manufacturing the optoelectronic device shown in FIG. 4B.

FIG. 28A shows the structure obtained after the forming of an optoelectronic circuit 90 comprising a plurality of optoelectronic circuits 42, three optoelectronic circuits 42 being shown as an example in FIG. 27A. As an example, in FIG. 28A, each optoelectronic circuit 42 is shown as comprising two optoelectronic circuits 26 separated by portion 47.

Figure 28B:
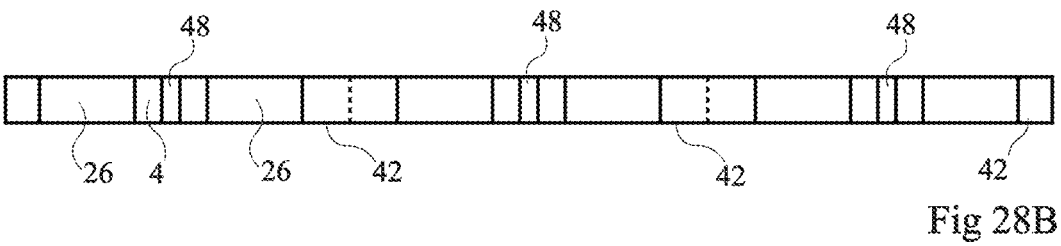

FIG. 28B shows the structure obtained after the forming of TSVs 48 crossing optoelectronic circuits 64. Each TSV 48 may be formed by etching an opening crossing optoelectronic circuit 90. This opening may have a circular or rectangular cross-section. The etching may be a deep reactive ion etching (DRIE). An insulating layer is then deposited on the walls of the opening. The insulating layer is for example formed by conformal deposition by PECVD or by conformal deposition of an insulating polymer. The insulating layer has a thickness in the range from 10 nm to 5,000 nm, for example, approximately 3 μm. The filling of the TSV may then be carried out by electrolytic copper deposition.

Figure 28C:
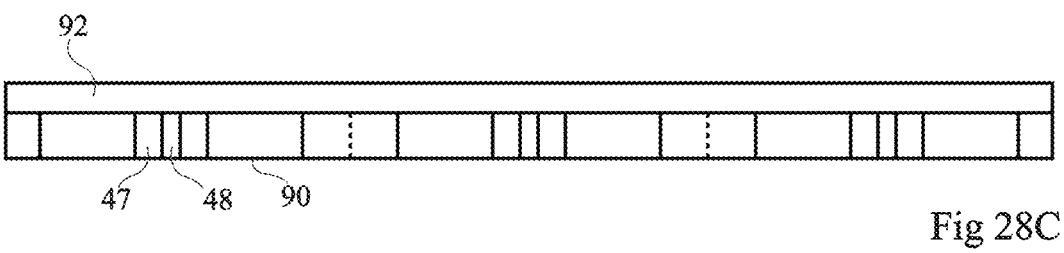

FIG. 28C shows the structure obtained after the deposition of an insulating layer 92 on optoelectronic circuit 90. Insulating layer 92 is made of the same material as the previously-described insulating portions 28. Insulating layer 92 may be deposited by CVD, PECVD, ALD, or cathode sputtering.

Figure 28D:
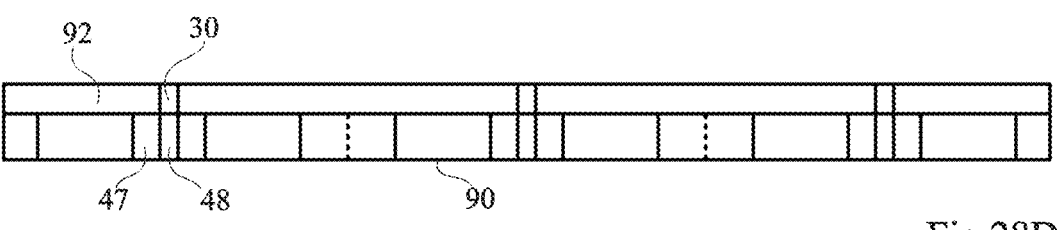

FIG. 28D shows the structure obtained after the forming of conductive elements 30 in insulating layer 92.

The subsequent steps of the method may be the same as those previously described in relation with FIGS. 27E to 27I.

Various embodiments with different variations have been described hereabove. It should be noted that those skilled in the art may combine various elements of these various embodiments and variations without showing any inventive step. As an example, the electric diagram shown in FIG. 3 may be implemented with the structure of device 40 shown in FIG. 4B and the electric diagram shown in FIG. 5 may be implemented with the structure of device 10 shown in FIGS. 1 and 2.

The invention claimed is:

1. A method of controlling an optoelectronic device comprising display pixels arranged in rows and in columns, each display pixel comprising an electronic circuit and at least one first optoelectronic circuit coupled to the electronic circuit and comprising at least one first light-emitting diode, the optoelectronic device further comprising first electrodes extending along the rows, each first electrode being connected to the electronic circuits of display pixels of at least one of the rows, second electrodes extending along the columns, each second electrode being connected to the electronic circuits of display pixels of at least one of the columns, and a circuit for controlling the first and second electrodes, the method comprising, in a first phase, activating the electronic circuits connected to one of the first electrodes and to one of the second electrodes by the following steps, carried out simultaneously:
   taking one of the first electrodes to a first potential, the other first electrodes being maintained at a second potential smaller than the first potential; and
   taking one of the second electrodes to a third potential smaller than the second potential, the other second electrodes being maintained at a fourth potential greater than the third potential and smaller than the second potential.

2. The control method of claim 1, comprising, after the first phase, a second phase comprising transmitting data to the electronic circuits connected to said one of the first electrodes and to said one of the second electrodes by varying the potential of said one of the first electrodes between the first potential and the second potential and by maintaining the potential of said one of the second electrodes at the fourth potential.

3. The control method of claim 2, comprising, during the second phase, transmitting signals having a discrete duration and transmitting signals having a non-discrete duration.

4. The control method of claim 2, wherein, during the second phase, the electronic circuits coupled to said one of the first electrodes and which are not coupled to said one of the second electrodes do not process the transmitted data.

5. The control method of claim 2, comprising turning off the light-emitting diodes of the display pixels coupled to said one of the first electrodes and/or to said one of the second electrodes.

6. The control method of claim 1, wherein each first optoelectronic circuit comprises a first transistor series-assembled with the first light-emitting diode, the second phase comprising maintaining said one of the first electrodes at the first potential for a first time period and wherein the first transistor is controlled at a first conduction level which depends on the first time period.

7. The control method of claim 6, wherein each display pixel comprises at least one second optoelectronic circuit coupled to the electronic circuit of said display pixel and comprising at least a second light-emitting diode and a second transistor series-assembled with the second light-emitting diode, the second phase comprising maintaining said one of the first electrodes at the first potential for a first time period and wherein the second transistor is controlled at a second conduction level which depends on the third time period.

8. The control method of claim 7, wherein each display pixel comprises at least one third optoelectronic circuit coupled to the electronic circuit of said display pixel and comprising at least a third light-emitting diode and a third transistor series-assembled with the third light-emitting diode, the second phase comprising maintaining said one of the first electrodes at the first potential for a third time period and wherein the third transistor is controlled at a third conduction level which depends on the third time period.

9. The control method of claim 8, wherein the first, second, and third time periods are successive, said one of the first electrodes being maintained at the second potential between the first time period and the second time period and for the second time period and the third time period.

10. An optoelectronic device comprising display pixels arranged in rows and in columns, each display pixel comprising an electronic circuit and at least one first optoelectronic circuit coupled to the electronic circuit and comprising at least one first light-emitting diode, the optoelectronic device further comprising first electrodes extending along the rows, each first electrode being connected to the electronic circuits of display pixels of at least one of the rows, second electrodes extending along the columns, each second column being connected to the electronic circuits of display pixels of at least one of the columns, and a circuit for controlling the first and second electrodes capable, during a first, of simultaneously:
   taking one of the first electrodes to a first potential, the other first electrodes being maintained at a second potential smaller than the first potential; and
   taking one of the second electrodes to a third potential smaller than the second potential, the other second electrodes being maintained at a fourth potential greater than the third potential and smaller than the second potential,
   which results in the activation of the electronic circuits connected to said one of the first electrodes and to said one of the second electrodes.

11. The device of claim 10, wherein the control circuit is capable, after the first phase, during a second phase, of transmitting data to the electronic circuits connected to said one of the first electrodes and to said one of the second electrodes by varying the potential of said one of the first electrodes between the first potential and the second potential and by maintaining the potential of said one of the second electrodes at the fourth potential.

12. The device of claim 11, wherein the control circuit is capable, during the second phase, of transmitting signals having a discrete duration and signals having a non-discrete duration.

13. The device of claim 11, wherein, during the second phase, the electronic circuits coupled to said one of the first electrodes and which are not coupled to said one of the second electrodes are capable of not processing the transmitted data.

14. The device of claim 11, wherein the electronic circuits coupled to said one of the first electrodes and/or to said one of the second electrodes are capable of turning off the associated light-emitting diodes.

15. The device of claim 11, wherein each first optoelectronic circuit comprises a first transistor series-assembled with the first light-emitting diode, the control circuit being capable, during the first phase, of maintaining said one of the first electrodes at the first potential for a first time period, the first optoelectronic circuit being capable of turning on the first transistor at a first conduction level which depends on the first time period.

16. The device of claim 15, wherein each display pixel comprises at least one second optoelectronic circuit coupled to the electronic circuit of said display pixel and comprising at least a second light-emitting diode and a second transistor series-assembled with the second light-emitting diode, the control circuit being capable, during the second phase, of maintaining said one of the first electrodes at the first potential for a second time period, the second optoelectronic circuit being capable of turning on the second transistor at a second conduction level which depends on the second time period.

17. The device of claim 16, wherein each display pixel comprises at least one third optoelectronic circuit coupled to the electronic circuit and comprising at least a third light-emitting diode and a third transistor series-assembled with the third light-emitting diode, the control circuit being capable, during the second phase, of maintaining said one of the first electrodes at the first potential for a third time period, the third optoelectronic circuit being capable of turning on the third transistor at a third conduction level which depends on the third time period.

18. The device of claim 17, wherein the first, second, and third time periods are successive, the control circuit being capable of maintaining said one of the first electrodes at the second potential between the first time period and the second time period and for the second time period and the third time period.

* * * * *